(12) United States Patent
Yamagami et al.

(10) Patent No.: US 9,831,212 B2
(45) Date of Patent: Nov. 28, 2017

(54) SEMICONDUCTOR DEVICE

(71) Applicant: ROHM CO., LTD., Kyoto (JP)

(72) Inventors: Mamoru Yamagami, Kyoto (JP); Kenji Fujii, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/503,148

(22) Filed: Sep. 30, 2014

(65) Prior Publication Data
US 2015/0091164 A1 Apr. 2, 2015

(30) Foreign Application Priority Data
Oct. 1, 2013 (JP) .................................. 2013-206560

(51) Int. Cl.
*H01L 23/492* (2006.01)
*H01L 23/00* (2006.01)
(Continued)

(52) U.S. Cl.
CPC ........ *H01L 24/49* (2013.01); *H01L 23/49524* (2013.01); *H01L 24/05* (2013.01); *H01L 24/06* (2013.01); *H01L 24/13* (2013.01); *H01L 24/36* (2013.01); *H01L 24/40* (2013.01); *H01L 24/41* (2013.01); *H01L 24/73* (2013.01); *H01L 23/3107* (2013.01); *H01L 23/49548* (2013.01); *H01L 23/525* (2013.01); *H01L 23/53223* (2013.01); *H01L 23/53238* (2013.01); *H01L 24/14* (2013.01); *H01L 24/16* (2013.01); *H01L 24/45* (2013.01); *H01L 24/48* (2013.01); *H01L 2224/02375* (2013.01); *H01L 2224/0346* (2013.01); *H01L 2224/0347* (2013.01); *H01L 2224/0391* (2013.01); *H01L 2224/03914* (2013.01); *H01L 2224/0401* (2013.01); *H01L 2224/04034* (2013.01);
(Continued)

(58) Field of Classification Search
CPC ............. H01L 23/3185; H01L 23/4822; H01L 23/4855; H01L 23/535; H01L 24/44; H01L 24/46; H01L 24/89
See application file for complete search history.

(56) References Cited

U.S. PATENT DOCUMENTS 5,016,084 A * 5/1991 Nakao ................. H01L 23/3121
257/693
5,321,204 A * 6/1994 Ko .......................... H01L 21/50
174/551
(Continued)

FOREIGN PATENT DOCUMENTS

JP 2011-023748 A 2/2011
JP 2011-055006 A 3/2011
(Continued)

*Primary Examiner* — Earl Taylor
(74) *Attorney, Agent, or Firm* — Rabin & Berdo, P.C.

(57) ABSTRACT

An inventive semiconductor device includes: a semiconductor chip including an integrated circuit; a plurality of electrode pads provided on the semiconductor chip and connected to the integrated circuit; a rewiring to which the electrode pads are electrically connected together, the rewiring being exposed on an outermost surface of the semiconductor chip and having an exposed surface area greater than the total area of the electrode pads; and a resin package which seals the semiconductor chip.

41 Claims, 23 Drawing Sheets

(51) Int. Cl.
  *H01L 23/495* (2006.01)
  *H01L 23/31* (2006.01)
  *H01L 23/525* (2006.01)
  *H01L 23/532* (2006.01)

(52) U.S. Cl.
  CPC ........... *H01L 2224/04042* (2013.01); *H01L 2224/05008* (2013.01); *H01L 2224/05009* (2013.01); *H01L 2224/05022* (2013.01); *H01L 2224/05026* (2013.01); *H01L 2224/05147* (2013.01); *H01L 2224/05164* (2013.01); *H01L 2224/05166* (2013.01); *H01L 2224/05548* (2013.01); *H01L 2224/05554* (2013.01); *H01L 2224/05557* (2013.01); *H01L 2224/05567* (2013.01); *H01L 2224/05571* (2013.01); *H01L 2224/05583* (2013.01); *H01L 2224/05624* (2013.01); *H01L 2224/05647* (2013.01); *H01L 2224/05655* (2013.01); *H01L 2224/08245* (2013.01); *H01L 2224/131* (2013.01); *H01L 2224/13024* (2013.01); *H01L 2224/13076* (2013.01); *H01L 2224/13147* (2013.01); *H01L 2224/13582* (2013.01); *H01L 2224/13655* (2013.01); *H01L 2224/13664* (2013.01); *H01L 2224/1411* (2013.01); *H01L 2224/16245* (2013.01); *H01L 2224/40245* (2013.01); *H01L 2224/40247* (2013.01); *H01L 2224/40479* (2013.01); *H01L 2224/40491* (2013.01); *H01L 2224/40499* (2013.01); *H01L 2224/40993* (2013.01); *H01L 2224/4112* (2013.01); *H01L 2224/45015* (2013.01); *H01L 2224/45124* (2013.01); *H01L 2224/45144* (2013.01); *H01L 2224/45147* (2013.01); *H01L 2224/48177* (2013.01); *H01L 2224/48247* (2013.01); *H01L 2224/48824* (2013.01); *H01L 2224/48847* (2013.01); *H01L 2224/48855* (2013.01); *H01L 2224/4912* (2013.01); *H01L 2224/49177* (2013.01); *H01L 2224/73221* (2013.01); *H01L 2924/00014* (2013.01); *H01L 2924/181* (2013.01); *H01L 2924/351* (2013.01)

(56) References Cited

U.S. PATENT DOCUMENTS

| | | | | |
|---|---|---|---|---|
| 5,728,247 | A * | 3/1998 | Bustrich | H01L 24/73 156/196 |
| 6,236,109 | B1 * | 5/2001 | Hsuan | H01L 23/49572 257/623 |
| 6,380,620 | B1 * | 4/2002 | Suminoe | H01L 23/36 257/675 |
| 6,475,824 | B1 * | 11/2002 | Kim | H01L 31/115 257/433 |
| 6,605,528 | B1 * | 8/2003 | Lin | H01L 21/768 257/750 |
| 6,967,395 | B1 * | 11/2005 | Glenn | H01L 23/3107 257/666 |
| 6,982,484 | B2 * | 1/2006 | Ogura | H01L 23/3114 156/330 |
| 7,045,899 | B2 * | 5/2006 | Yamane | H01L 23/3114 257/688 |
| 7,074,649 | B2 * | 7/2006 | Hedler | H01L 23/3114 257/701 |
| 7,342,312 | B2 * | 3/2008 | Komiya | H01L 23/3114 257/734 |
| 7,582,512 | B2 * | 9/2009 | Jobetto | H01L 23/5389 257/E21.596 |
| 7,727,877 | B2 * | 6/2010 | Kang | H01L 24/11 257/E21.586 |
| 7,851,929 | B2 * | 12/2010 | Komiya | H01L 23/3114 257/782 |
| 8,134,238 | B2 * | 3/2012 | Komiya | H01L 23/3114 257/782 |
| 8,319,323 | B2 * | 11/2012 | Letterman, Jr. | H01L 21/561 174/260 |
| 8,405,208 | B2 * | 3/2013 | Komiya | H01L 23/3114 257/734 |
| 8,455,303 | B2 * | 6/2013 | Zhang | H01L 23/49513 257/E21.506 |
| 8,586,480 | B1 * | 11/2013 | Zommer | H01L 24/34 438/119 |
| 8,653,656 | B2 * | 2/2014 | Komiya | H01L 23/3114 257/734 |
| 9,006,885 | B2 * | 4/2015 | Komiya | H01L 23/3114 257/734 |
| 9,082,438 | B2 * | 7/2015 | Yoshioka | G11B 5/486 |
| 2002/0171130 | A1 * | 11/2002 | Takahashi | H01L 23/49572 257/673 |
| 2003/0031867 | A1 * | 2/2003 | Ogura | H01L 23/3114 428/355 R |
| 2003/0230792 | A1 * | 12/2003 | Wu | H01L 23/4951 257/666 |
| 2005/0014309 | A1 * | 1/2005 | Hedler | H01L 23/3114 438/106 |
| 2005/0263860 | A1 * | 12/2005 | Hirano | H01L 23/5389 257/659 |
| 2006/0065982 | A1 * | 3/2006 | Komiya | H01L 23/3114 257/780 |
| 2006/0125082 | A1 * | 6/2006 | Wakabayashi | H01L 23/3114 257/698 |
| 2006/0138617 | A1 * | 6/2006 | Miyaki | H01L 23/49582 257/666 |
| 2006/0255437 | A1 * | 11/2006 | Nomura | H01L 23/49582 257/666 |
| 2007/0216016 | A1 * | 9/2007 | Im | H01L 23/4334 257/692 |
| 2007/0290336 | A1 * | 12/2007 | Sun | H01L 23/49524 257/735 |
| 2008/0136047 | A1 * | 6/2008 | Komiya | H01L 23/3114 257/786 |
| 2008/0217772 | A1 * | 9/2008 | Watanabe | H01L 23/3114 257/737 |
| 2008/0251894 | A1 * | 10/2008 | Kojima | H01L 21/6835 257/659 |
| 2009/0032977 | A1 * | 2/2009 | Yamaguchi | H01L 23/3107 257/787 |
| 2010/0059875 | A1 * | 3/2010 | Sato | H01L 23/4952 257/690 |
| 2010/0123240 | A1 * | 5/2010 | Sato | H01L 23/4334 257/692 |
| 2010/0187678 | A1 * | 7/2010 | Kajiwara | H01L 21/56 257/692 |
| 2011/0024901 | A1 * | 2/2011 | Yamashita | H01L 24/11 257/737 |
| 2011/0042833 | A1 * | 2/2011 | Komiya | H01L 23/3114 257/786 |
| 2011/0068457 | A1 * | 3/2011 | Zhang | H01L 23/49513 257/692 |
| 2011/0070698 | A1 * | 3/2011 | Zhang | H01L 23/49513 438/113 |
| 2011/0081750 | A1 * | 4/2011 | Machida | H01L 21/4842 438/123 |
| 2012/0104621 | A1 * | 5/2012 | Jang | H01L 23/142 257/773 |
| 2012/0106109 | A1 * | 5/2012 | Kim | H01L 24/83 361/771 |
| 2012/0133058 | A1 * | 5/2012 | Komiya | H01L 23/3114 257/786 |
| 2012/0235278 | A1 * | 9/2012 | Shigihara | H01L 24/03 257/532 |
| 2012/0313234 | A1 * | 12/2012 | Shen | H01L 24/11 257/677 |
| 2012/0322207 | A1 * | 12/2012 | Zhang | H01L 23/49513 438/113 |

(56) References Cited

U.S. PATENT DOCUMENTS

| | | | | |
|---|---|---|---|---|
| 2013/0009299 A1* | 1/2013 | Takada | ............... | H01L 23/49503 257/676 |
| 2013/0009300 A1* | 1/2013 | Yato | ........................ | H01L 24/92 257/676 |
| 2013/0087916 A1* | 4/2013 | Lin | ..................... | H01L 23/5389 257/738 |
| 2013/0161815 A1* | 6/2013 | Komiya | .............. | H01L 23/3114 257/737 |
| 2013/0207256 A1* | 8/2013 | Uno | ................ | H01L 21/823475 257/712 |
| 2013/0221530 A1* | 8/2013 | Miyata | .................... | H01L 21/78 257/762 |
| 2013/0221532 A1* | 8/2013 | Fujita | ..................... | H01L 24/34 257/773 |
| 2014/0021618 A1* | 1/2014 | Shigihara | .......... | H01L 23/49811 257/762 |
| 2014/0061900 A1* | 3/2014 | Park | ........................ | H01L 24/06 257/737 |
| 2014/0084433 A1* | 3/2014 | Otremba | ................ | H01L 24/36 257/676 |
| 2014/0103510 A1* | 4/2014 | Andou | ........ | H01L 23/49551 257/676 |
| 2014/0117519 A1* | 5/2014 | Komiya | .............. | H01L 23/3114 257/668 |
| 2014/0231125 A1* | 8/2014 | Chen | ....................... | H05K 3/281 174/261 |
| 2014/0291827 A1* | 10/2014 | Sato | .................. | H01L 23/49541 257/676 |
| 2014/0374926 A1* | 12/2014 | Miyakawa | .............. | H01L 24/29 257/786 |
| 2015/0021750 A1* | 1/2015 | Fujino | .................... | H01L 23/24 257/667 |
| 2015/0021780 A1* | 1/2015 | Gong | ....................... | H05K 3/32 257/773 |
| 2015/0091164 A1* | 4/2015 | Yamagami | ........ | H01L 23/49524 257/737 |

FOREIGN PATENT DOCUMENTS

| | | | |
|---|---|---|---|
| JP | 2011-071147 | A | 4/2011 |
| JP | 2011-159818 | A | 8/2011 |
| JP | 2012-109581 | A | 6/2012 |
| JP | 2013-115054 | A | 6/2013 |
| KR | 20020016076 | A * | 3/2002 |
| WO | WO 2012-137714 | A1 | 10/2012 |

* cited by examiner

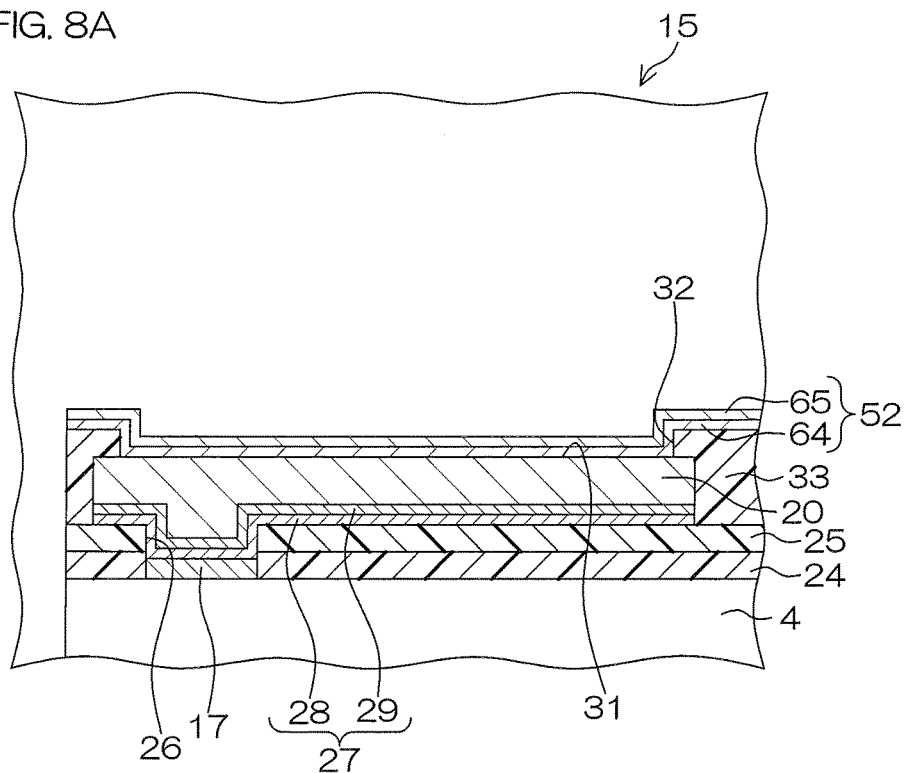
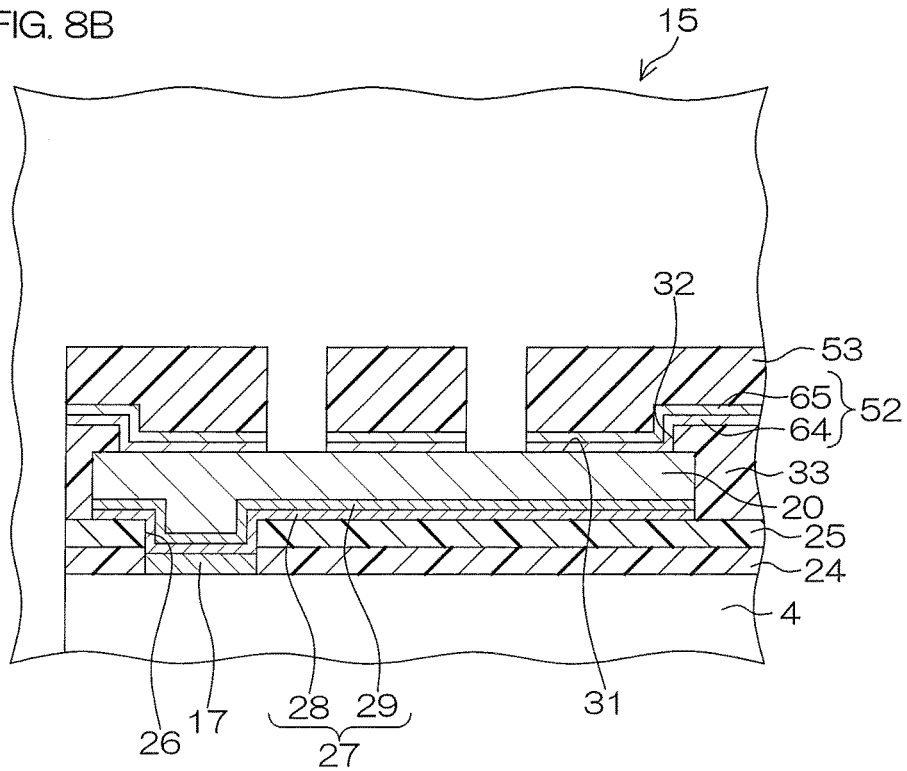

66

66

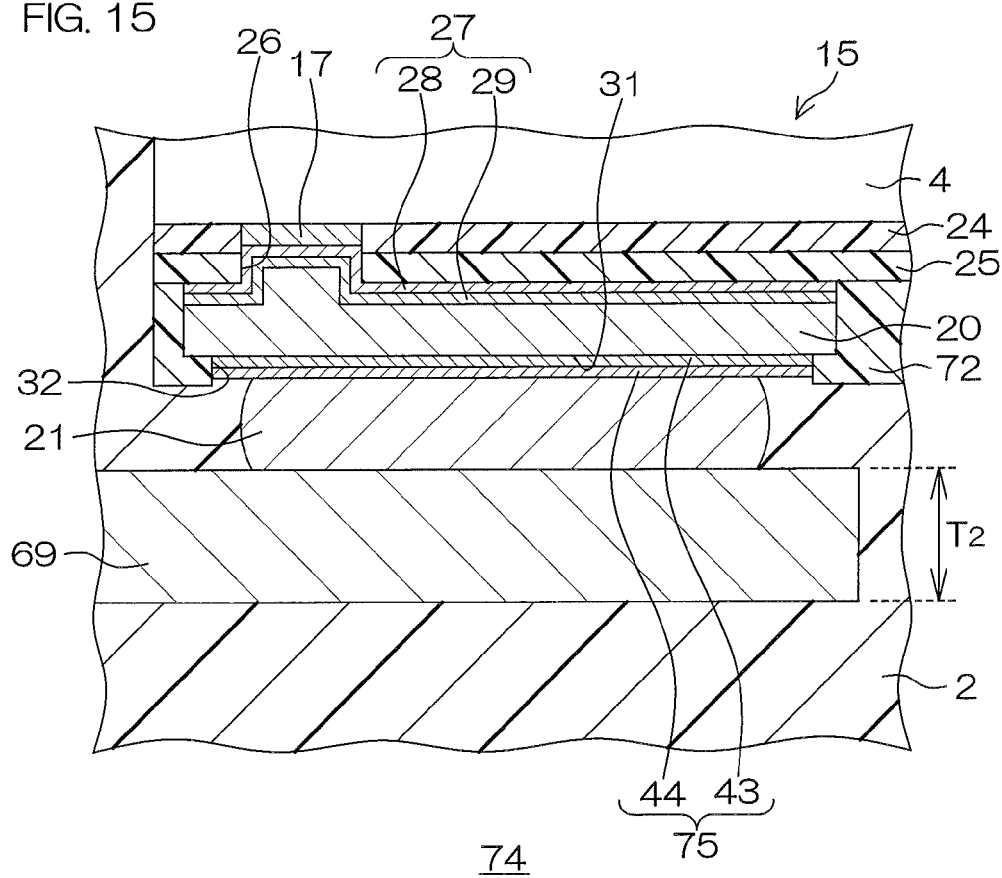

SEMICONDUCTOR DEVICE

CROSS-REFERENCE TO RELATED APPLICATIONS

This application corresponds to Japanese Patent Application No. 2013-206560 filed in the Japan Patent Office on Oct. 1, 2013, the disclosure of which is incorporated herein by reference in its entirety.

FIELD OF THE INVENTION

The present invention relates to a semiconductor device including an integrated circuit.

BACKGROUND ART

Patent Document 1 (JP2013-115054A) discloses a semiconductor chip which includes a semiconductor substrate having a front surface formed with a plurality of semiconductor elements, an interlevel insulation film provided on the semiconductor substrate, a plurality of electrode pads provided on the interlevel insulation film, and a surface protection film provided on the interlevel insulation film and having pad openings through which the electrode pads are respectively exposed. The electrode pads are respectively connected to bonding wires in a resin package.

BRIEF SUMMARY OF THE INVENTION

With recent higher integration of semiconductor devices, the semiconductor devices tend to have an increased number of electrode pads provided on a semiconductor substrate thereof. Where the semiconductor device has a wiring structure disclosed in Patent Document 1, it is necessary to form the increased number of electrode pads in a limited space in the semiconductor device. Therefore, as the number of the electrode pads increases, it is necessary to reduce the size of each of the electrode pads. In this case, only relatively thin bonding wires are usable, so that a resistance between the semiconductor chip and the resin package is increased.

A conceivable approach to reduction of the resistance between the semiconductor chip and the resin package is to increase the sizes of connection members such as the bonding wires. In this case, however, the electrode pads for connection to the bonding wires or other connection members should be increased in size.

In a semiconductor device having an integrated circuit provided on a semiconductor substrate thereof, a plurality of electrode pads are provided on the semiconductor substrate and, therefore, has limitation in wiring design rule, unlike in a semiconductor device including discrete components. That is, where one of the electrode pads has an increased size, the other electrode pads should be provided in a region of the semiconductor substrate in which the one electrode pad is absent. Therefore, the routing of wirings connected to the electrode pads and the lengths of the bonding wires should be properly adjusted. This may elongate the wiring route, thereby correspondingly increasing the resistance of the semiconductor chip.

It is therefore an object of the present invention to provide a semiconductor device which includes a semiconductor chip including an integrated circuit and packaged in a resin package, wherein a resistance between the semiconductor chip and the resin package is reduced while the increase in the resistance of the semiconductor chip is suppressed.

BRIEF DESCRIPTION OF THE DRAWINGS

FIGS. 8A to 8D are sectional views for explaining an exemplary production process for the semiconductor device shown in FIG. 6.

FIG. 15 is a schematic enlarged sectional view showing a wiring region of a semiconductor device according to an eighth embodiment of the present invention.

DETAILED DESCRIPTION OF THE INVENTION

Figure 1:
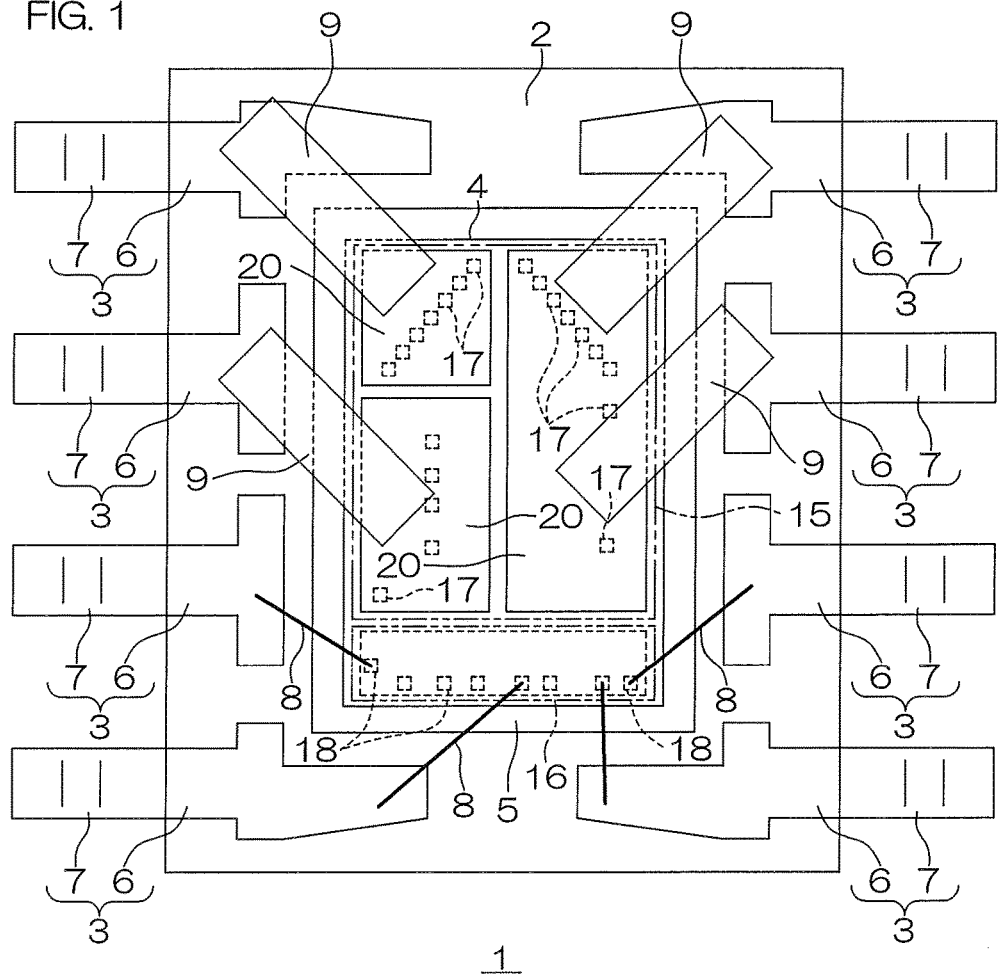
FIG. 1 is a schematic plan view showing the inside of a semiconductor device according to a first embodiment of the present invention.

A semiconductor device according to the present invention includes: a semiconductor chip including an integrated circuit; a plurality of electrode pads provided on the semiconductor chip and connected to the integrated circuit; a rewiring to which the electrode pads are electrically connected together, the rewiring being exposed on an outermost surface of the semiconductor chip and having an exposed surface area greater than the total area of the electrode pads; and a resin package which seals the semiconductor chip.

With this arrangement, the rewiring having an area greater than the total area of the electrode pads is connected to the electrode pads and, therefore, can be used as a connection member for power supply to the electrode pads. This reduces a resistance between the semiconductor chip and the resin package.

On the other hand, the electrode pads can be designed without consideration of the thickness of the connection member (e.g., bonding wire). That is, the electrode pads can be formed in a proper pattern in conformity with a wiring design rule. As a result, the elongation of the wiring route is prevented, thereby suppressing the increase in the resistance of the semiconductor chip.

The rewiring may cover the plurality of electrode pads.

The rewiring may include a plurality of rewirings provided on the semiconductor chip and spaced from each other along the surface of the semiconductor chip.

Different voltages are often applied to the electrode pads on the semiconductor chip including the integrated circuit. The electrode pads may be grouped according to the voltage to be applied thereto, and the rewirings may be provided for the respective groups of electrode pads.

The semiconductor device may further include a lead selectively sealed in the resin package, and a connection member sealed in the resin package for electrical connection between the rewiring and the lead.

The connection member may include an electrically conductive plate.

With this arrangement, the rewiring is electrically connected to the lead via the electrically conductive plate. Therefore, the resistance between the semiconductor chip and the resin package can be effectively reduced.

The semiconductor chip may be connected to the connection member in an attitude such that the surface of the semiconductor chip formed with the rewiring faces up.

The rewiring may be connected to the connection member via solder.

With this arrangement, the connection between the rewiring and the connection member can be easily achieved with the use of the solder.

The semiconductor device may further include a columnar post projecting from a surface of the rewiring.

With this arrangement, variations in the inclination of the connection member can be effectively suppressed when the rewiring is connected to the connection member. Where the rewiring is connected to the connection member via the solder, thermal stress occurring during the melting of the solder can be absorbed by the post. This effectively prevents the rewiring and the connection member from being influenced by the thermal stress. Thus, the connection strength between the semiconductor chip and the connection member can be further improved.

The semiconductor chip may be connected to the connection member in an attitude such that the surface of the semiconductor chip formed with the rewiring faces down.

The semiconductor device may further include a columnar post projecting from the surface of the rewiring.

With this arrangement, the connection member is effectively prevented from being misaligned with the rewiring when being connected to the rewiring. Further, the semiconductor chip is effectively prevented from being inclined when being connected to the connection member. That is, the semiconductor device of this arrangement ensures proper self-alignment and proper leveling.

The post may be connected directly to the connection member.

The rewiring may be connected to the connection member via solder.

With this arrangement, the connection between the rewiring and the connection member can be easily achieved with the use of the solder. Where the post is provided on the rewiring, thermal stress occurring during the melting of the solder can be absorbed by the post. This effectively prevents the rewiring and the connection member from being influenced by the thermal stress. Thus, the connection strength between the semiconductor chip and the connection member can be further improved.

The post may include a plurality of posts arranged in an array.

The post may be provided in a region in which the electrode pads are absent.

In this case, a pressure generated when the post is connected to the connection member is not conducted directly to the electrode pads, so that the connection between the electrode pads and the integrated circuit can be properly maintained.

The post may include a Cu-containing metal material. In this case, the post may be selectively coated by Ni plating or Ni/Pd (nickel/palladium) plating.

With this arrangement, the post is coated by the Ni plating or the Ni/Pd (nickel/palladium) plating. Thus, the post is improved in wettability with the solder. Further, the solder is effectively prevented from infiltrating into the post when the post is connected to the connection member by the solder. This improves the connection strength between the post and the connection member.

The semiconductor device may further include a surface protection film covering the rewiring and having a wiring pad opening through which a part of the rewiring is selectively exposed as a wiring pad, and the post may be connected to the rewiring via the wiring pad opening.

With this arrangement, the wiring pad opening provides a space for accommodating the solder. When the solder is melted in the semiconductor device production process, therefore, the solder is effectively prevented from flowing to an adjacent wiring pad.

The semiconductor device may further include a surface protection film which covers the rewiring, and the post extends through the surface protection film to be electrically connected to the rewiring.

The rewiring may include Cu- or Al-containing metal material.

The rewiring may be selectively coated by Ni plating or Ni/Pd (nickel/palladium) plating.

With this arrangement, the rewiring is coated by the Ni plating or the Ni/Pd (nickel/palladium) plating. Thus, the rewiring is improved in wettability with the solder. Where the rewiring is made of Cu, the solder is effectively prevented from infiltrating into the rewiring when the rewiring is connected to the connection member by the solder. This improves the connection strength between the rewiring and the connection member.

The rewiring may be connected to the electrode pads via an under-bump metal layer.

The electrode pads may include an Al-containing metal material.

Embodiments of the present invention will hereinafter be described in detail with reference to the attached drawings.

Figure 2:
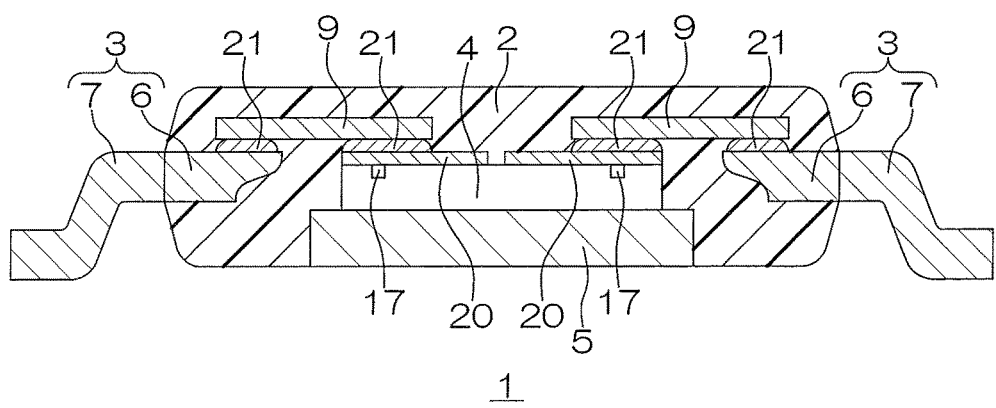
FIG. 2 is a schematic sectional view of the semiconductor device shown in FIG. 1.

FIG. 1 is a schematic plan view showing the inside of a semiconductor device 1 according to a first embodiment of the present invention. FIG. 2 is a schematic sectional view of the semiconductor device 1 shown in FIG. 1.

As shown in FIGS. 1 and 2, the semiconductor device 1 includes a semiconductor chip 4 including an integrated circuit (an example of the semiconductor chip in the present invention), an island 5 on which the semiconductor chip 4 is mounted, a plurality of leads 3, and a resin package 2 which seals these components. The resin package 2 is made of, for example, an epoxy resin.

The semiconductor chip 4 has a rectangular shape as seen in plan in FIG. 1. A wiring region 15 (a region enclosed by a two-dot-and-dash line in FIG. 1) in which connection members are connected to the integrated circuit for power supply to the integrated circuit and a signal region 16 (a region enclosed by a broken line in FIG. 1) in which a connection member is connected to signal elements (e.g., signal ICs) for power supply to the signal elements are defined on a surface of the semiconductor chip 4. The semiconductor chip 4 is mounted on the island 5 in an attitude such that the surface on which the wiring region 15 and the signal region 16 are defined faces up. The island 5 is embedded in a center portion of the resin package 2 so as to be exposed in a lower surface of the resin package 2. The island 5 is, for example, a metal frame made of Cu (copper) or 42-alloy, and serves as a heat sink for releasing the heat of the semiconductor chip 4 to the outside.

A plurality of first electrode pads 17 electrically connected to the integrated circuit and a plurality of rewirings 20 are provided in the wiring region 15 of the semiconductor chip 4. The first electrode pads 17 each have a generally rectangular shape as seen in plan in FIG. 1.

In this embodiment, the rewirings 20 include three rewirings 20 having different areas. The rewirings 20 each cover a plurality of first electrode pads 17, which are electrically connected together to the corresponding rewiring 20. In this embodiment, the rewirings 20 each have a generally rectangular shape as seen in plan. The rewirings 20 are exposed on the outermost surface of the semiconductor chip 4, and each have an exposed surface area greater than the total area of the first electrode pads 17. The rewirings 20 are disposed in spaced relation in the wiring region 15, and electrically isolated from each other. Thus, different voltages independent of each other can be applied to the respective rewirings 20.

The number of the rewirings 20 may be changed, as required, according to the use purpose of the integrated circuit, the voltage to be applied to the integrated circuit, and the like. Therefore, only one rewiring 20 may be provided in the wiring region 15, or three or more rewirings (plural rewirings) 20 may be provided in the wiring region 15. In this case, some of the first electrode pads 17 may be provided outside the rewirings 20.

On the other hand, a plurality of second electrode pads 18 electrically connected to the signal elements are provided in the signal region 16 of the semiconductor chip 4. The second electrode pads 18 each have a generally rectangular shape as seen in plan in FIG. 1, and are exposed on the outermost surface of the semiconductor chip 4. In this embodiment, the second electrode pads 18 other than the first electrode pads 17 for the integrated circuit are disposed adjacent the rewirings 20 as seen in plan.

The leads 3 are spaced from a pair of opposite edges of the semiconductor chip 4, and are arranged along the edges of the semiconductor chip 4 in spaced relation. The leads 3 each extend from the inside to the outside of the resin package 2. The leads 3 each include an inner lead portion 6 sealed in the resin package 2, and an outer lead portion 7 provided integrally with the inner lead portion 6 as extending outward of the resin package 2.

The inner lead portions 6 are selectively connected to the wiring region 15 via clips 9 (an example of the connection member (electrically conductive plate) in the present invention) and to the signal region 16 via bonding wires 8. On the other hand, the outer lead portions 7 are connected, for example, to a printed board. In this embodiment, eight leads 3 are provided by way of example, but the number of the leads 3 may be changed, as required, according to the construction of the semiconductor chip 4.

The bonding wires 8 electrically connect some of the inner lead portions 6 to the second electrode pads 18. Thus, electric power is supplied from the inner lead portions 6 to the second electrode pads 18 (signal elements) via the bonding wires 8. The bonding wires 8 each have a diameter of, for example, several micrometers to several tens micrometers, and are made of a metal material containing Al (aluminum), Cu, Au (gold) or the like.

On the other hand, as shown in FIG. 2, the clips 9 electrically connect the other inner lead portions 6 to the rewirings 20 via solder 21. Thus, electric power is supplied from the inner lead portions 6 to the rewirings 20 (first electrode pads 17) via the clips 9. The clips 9 each have a generally rectangular shape as seen in plan in FIG. 1. The clips 9 each have a greater area than the total area of the corresponding first electrode pads 17. Further, the clips 9 each have a greater area than the bonding wires 8, and the area is preferably not less than 0.25 mm$^2$ (which is equivalent to a square size of 0.5 mm×0.5 mm).

In this embodiment, the generally rectangular clips 9 as seen in plan are connected to the rewirings 20 by way of examples, but each two of the rectangular clips 9 may be combined together into an L-shaped clip. Wires each having a greater diameter than the bonding wires 8 (e.g., having a diameter of not less than 50 μm, more specifically, 50 μm to 100 μm) may be used instead of the clips 9.

Figure 3A:
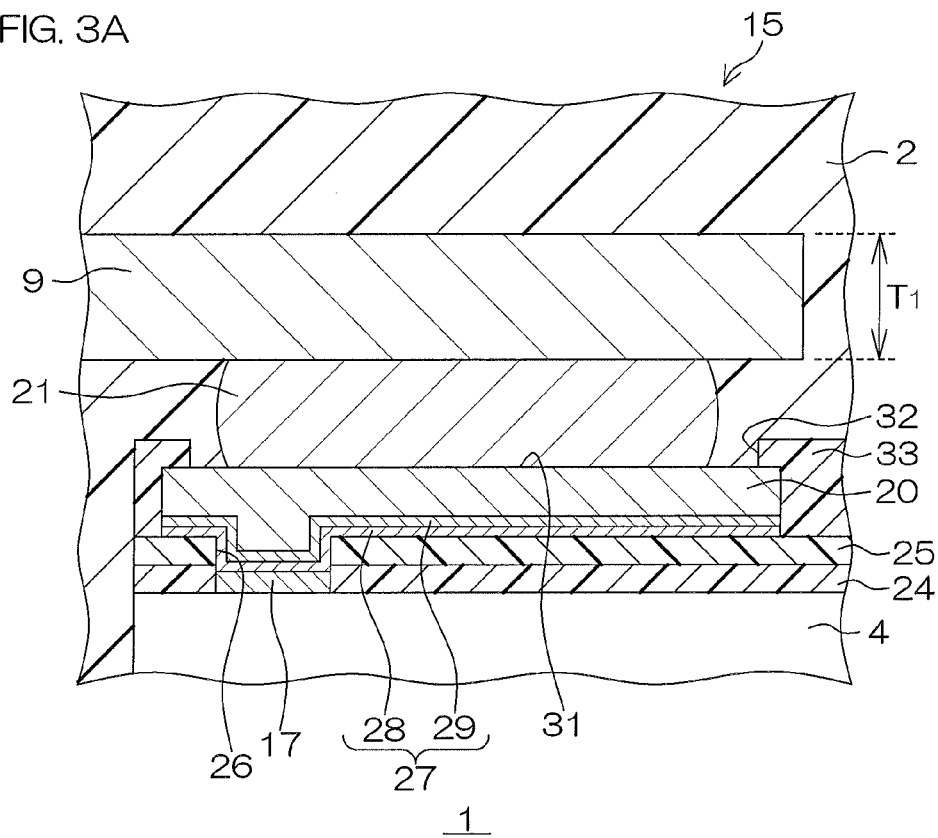
FIG. 3A is a schematic enlarged sectional view of a wiring region shown in FIG. 1.
Figure 3B:
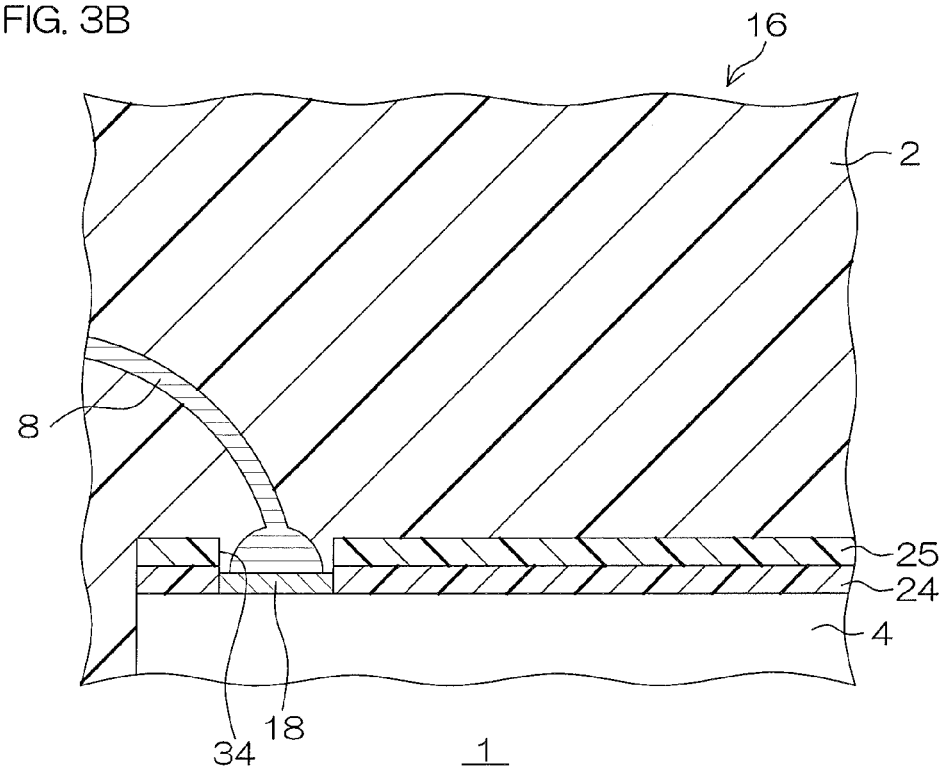
FIG. 3B is a schematic enlarged sectional view of a signal region shown in FIG. 1.

Referring to FIGS. 3A and 3B, the construction of the semiconductor chip 4 will next be described more specifically. FIG. 3A is a schematic enlarged sectional view of the wiring region 15 shown in FIG. 1. FIG. 3B is a schematic enlarged sectional view of the signal region 16 shown in FIG. 1.

The semiconductor chip 4 includes a silicon substrate formed with the integrated circuit, and a multilevel wiring structure provided on the silicon substrate. A passivation film 24 and a protection film 25 are provided in this order over the multilevel wiring structure as shown in FIGS. 3A and 3B. The passivation film 24 and the protection film 25 have first pad openings 26 and second pad openings 34, so that parts of uppermost wirings of the multilevel wiring structure are exposed as the first electrode pads 17 and the second electrode pads 18 through the first pad openings 26 and the second pad openings 34.

Examples of the integrated circuit to be provided in the semiconductor chip 4 include SSI (Small Scale Integration), LSI (Large Scale Integration), MSI (Medium Scale Integration), VLSI (Very Large Scale Integration) and ULSI (Ultra-very Large Scale Integration) which selectively include various types of semiconductor elements and passivation elements (e.g., transistors, diodes, resistors, capacitors and the like).

In this embodiment, the first pad openings 26 each have a generally rectangular shape as seen in plan and, therefore, the first electrode pads 17 each have a generally rectangular shape as seen in plan. The first electrode pads 17 are made of, for example, an Al-containing metal material. The first electrode pads 17 are electrically connected to the corresponding rewiring 20 via a UBM (under-bump metal) film 27.

As shown in FIG. 3A, the UBM film 27 is provided on a surface of the protection film 25, inner surfaces of the first pad openings 26 and surfaces of the first electrode pads 17. In other words, the UBM film 27 extends from the surface of the protection film 25 into the first pad openings 26 to be thereby electrically connected to the first electrode pads 17 in the first pad openings 26. Further, the UBM film 27 has the same area as the corresponding rewiring 20 as seen in plan in FIG. 1, and side surfaces of the UBM film 27 are flush with side surfaces of the rewiring 20. That is, the UBM film 27 is provided on the protection film 25 as covering the first electrode pads 17 together. The UBM film 27 has a double layer structure including two layers made of different metal materials. The UBM film 27 includes a Cu film 28 containing Cu and a Ti film. 29 containing Ti (titanium), which are provided in this order.

The rewiring 20 is provided along a surface of the UBM film 27. More specifically, the rewiring 20 is provided on the UBM film 27 with parts thereof entering recesses of the UBM film 27 in the first pad openings 26. Thus, the rewiring 20 is electrically connected to the first electrode pads 17 via the UBM film 27. The rewiring 20 has a thickness of, for example, not less than 3 μm. The rewiring 20 is preferably made of a Cu- or Al-containing metal material.

A rewiring protection film 33 having wiring pad openings 32 through which parts of the surfaces of the rewirings 20 are selectively exposed as wiring pads 31 is provided on the protection film 25. The wiring region 15 (rewirings 20) and the signal region 16 are defined by the rewiring protection film 33 to be thereby electrically isolated from each other.

The rewiring protection film 33 is made of, for example, a polyimide. The solder 21 is disposed in the wiring pad openings 32.

The wiring pads 31 (rewirings 20) are connected to the clips 9 via the solder 21. The clips 9 each have a thickness $T_1$ of, for example, 50 μm to 400 μm. The clips 9 are made of, for example, an electrically conductive material containing Cu or the like.

In this embodiment, on the other hand, the second pad openings 34 each have a generally rectangular shape as seen in plan and, therefore, the second electrode pads 18 each have a generally rectangular shape as seen in plan. The second electrode pads 18 are made of, for example, an Al-containing metal material. The bonding wires 8 respectively extend into the second pad openings 34 to be thereby connected to the second electrode pads 18 exposed on the outermost surface of the semiconductor chip 4.

FIGS. 4A to 4F are sectional views for explaining an exemplary production process for the semiconductor device 1 shown in FIG. 1. FIGS. 4A to 4F each correspond to the sectional view of FIG. 3A.

Figure 4A:
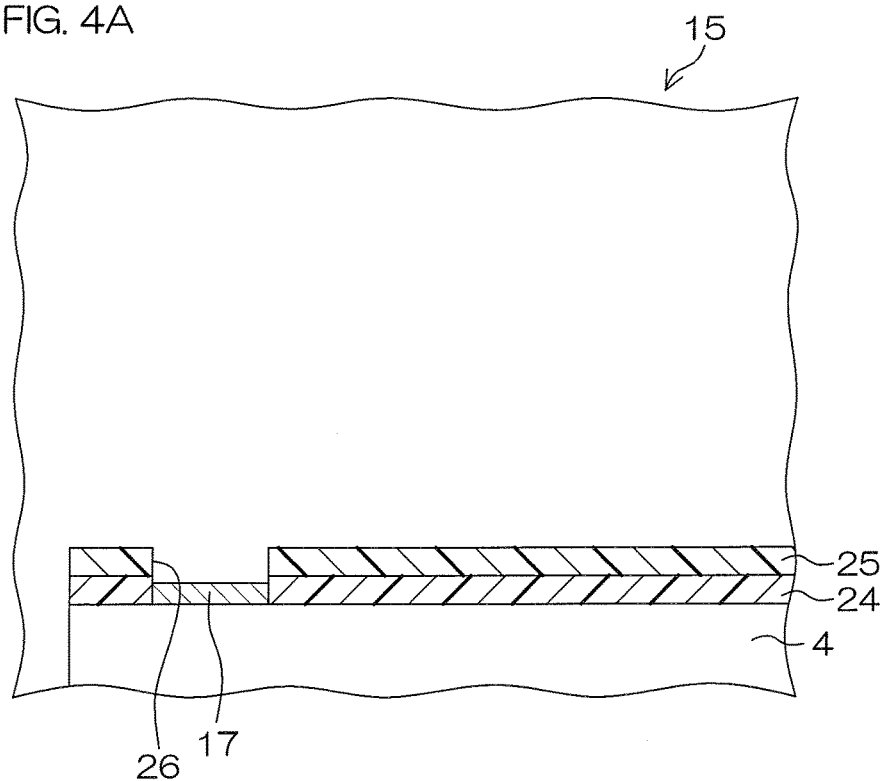
FIGS. 4A to 4F are sectional views for explaining an exemplary production process for the semiconductor device shown in FIG. 1.

For production of the semiconductor device 1, as shown in FIG. 4A, a multilevel wiring structure is formed on a silicon substrate formed with an integrated circuit. In turn, a passivation film 24 and a protection film 25 are formed in this order as covering the multilevel wiring structure. Then, the passivation film 24 and the protection film 25 are selectively etched, whereby a plurality of first pad openings 26 and a plurality of second pad openings 34 are formed through which parts of uppermost wirings of the multilevel wiring structure are exposed. Thus, the parts of the uppermost wirings of the multilevel wiring structure are exposed as first electrode pads 17 and second electrode pads 18 from the passivation film 24 and the protection film 25.

Figure 4B:
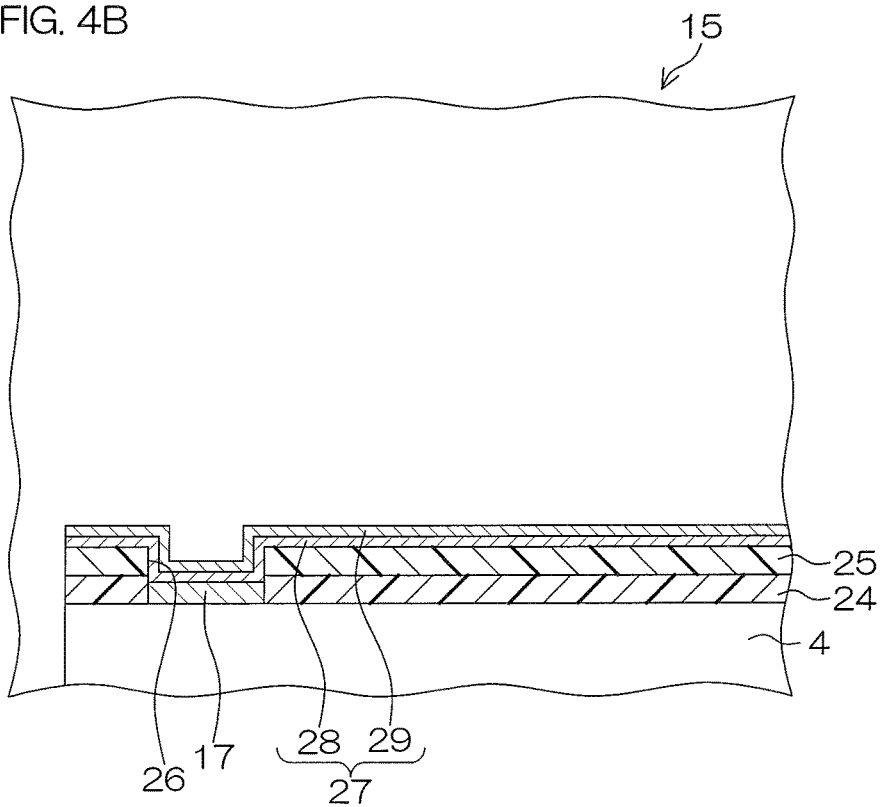

Subsequently, as shown in FIG. 4B, a Cu film 28 and a Ti film 29 are formed in this order as covering the surface of the semiconductor chip 4 by plating. Thus, a UBM film 27 is formed as covering the first electrode pads 17, the second electrode pads 18 and the protection film 25.

Figure 4C:
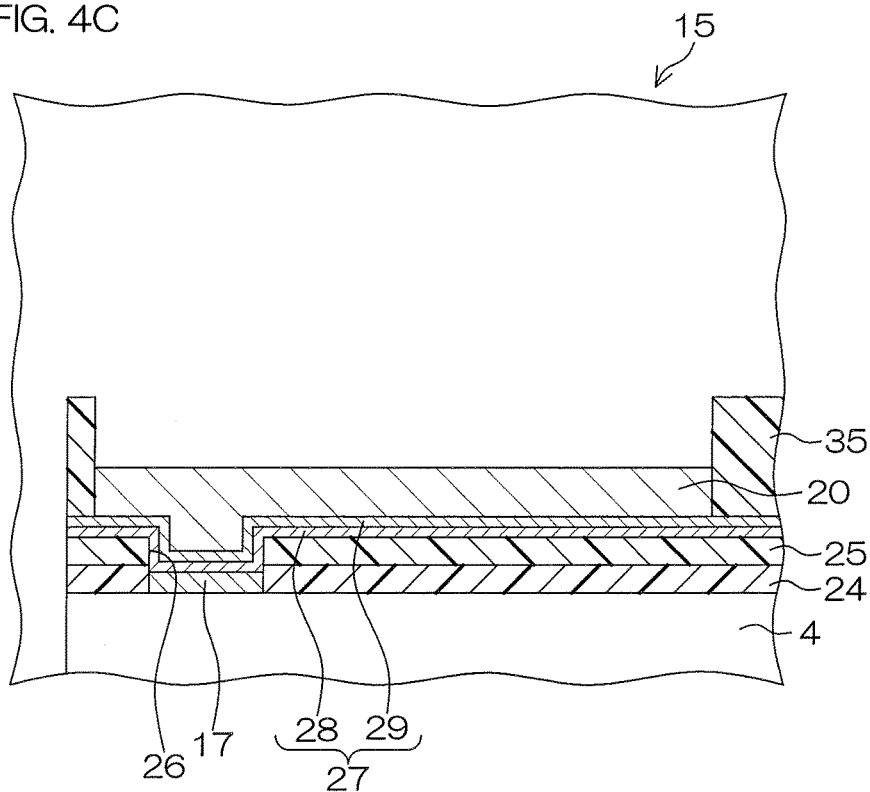

In turn, as shown in FIG. 4C, a resist mask 35 is patterned on the UBM film 27 so as to have openings selectively on regions of the UBM film 27 to be formed with rewirings 20. Then, an Al or Cu film is formed on the UBM film 27 via the resist mask 35 by plating. Thus, the rewirings 20 are formed on the UBM film 27. After the formation of the rewirings 20, a resist mask 35 is removed.

Figure 4D:
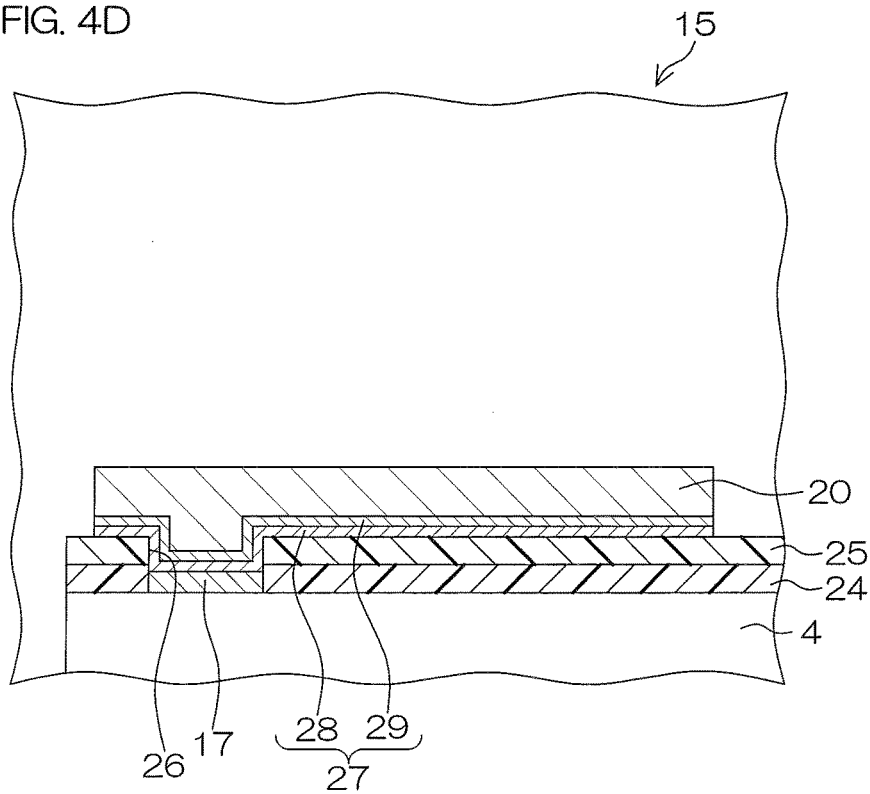

Subsequently, as shown in FIG. 4D, an unnecessary portion of the UBM film 27 is etched off with the use of the rewirings 20 as an etching mask. Thus, the resulting UBM films 27 respectively have the same areas as the corresponding rewirings 20, and side surfaces of the UBM films 27 are flush with side surfaces of the corresponding rewirings 20.

Figure 4E:
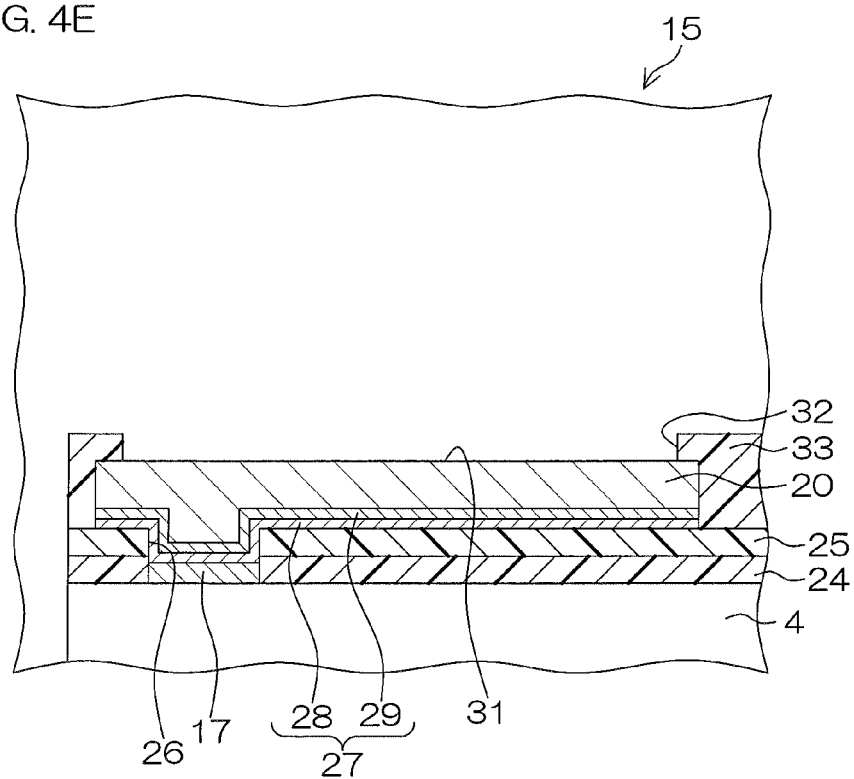

In turn, as shown in FIG. 4E, a polyimide is deposited over the rewirings 20 and the protection film 25. Then, the resulting polyimide film is patterned to selectively expose surfaces of the rewirings 20 as wiring pads 31. Thus, a rewiring protection film 33 having wiring pad openings 32 is formed.

Figure 4F:
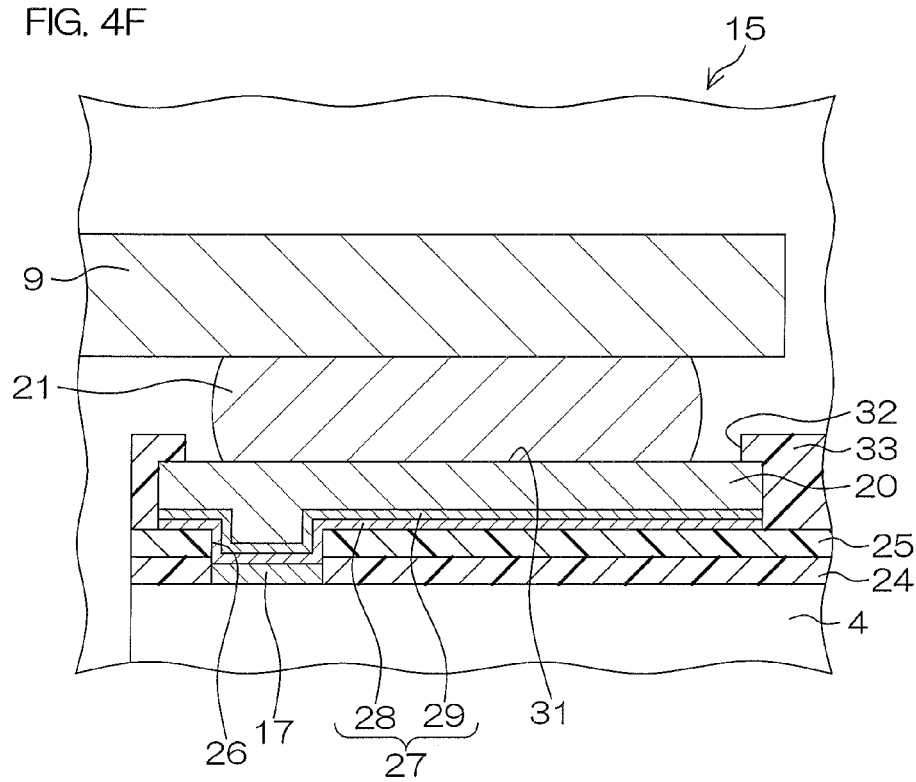

Subsequently, as shown in FIG. 4F, solder balls (solder 21), for example, are respectively formed in the wiring pad openings 32. Then, the semiconductor chip 4 is mounted on an island 5 in an attitude such that the surface of the semiconductor chip 4 on which a wiring region 15 and a signal region 16 are defined faces up (see FIG. 2). In turn, the wiring pads 31 and the second electrode pads 18 are connected to inner lead portions 6 via clips 9 and bonding wires 8, respectively. At this time, the connection between the rewirings 20 and the clips 9 can be easily achieved with the use of the solder 21.

Thereafter, the semiconductor chip 4, the island 5, the inner lead portions 6, the clips 9, the bonding wires 8 and the like are sealed in an epoxy resin. Thus, the semiconductor device 1 shown in FIGS. 1 and 2 is produced.

In the semiconductor device 1, as described above, the first electrode pads 17 are connected together to the rewiring 20 having an area greater than the total area of the first electrode pads 17. Therefore, the clip 9 having an area greater than the total area of the first electrode pads 17 can be used as the connection member for supplying electric power to the first electrode pads 17. Thus, the resistance between the semiconductor chip 4 and the resin package 2 can be reduced as compared with a case in which the bonding wires 8 are respectively connected to the first electrode pads 17.

On the other hand, the first electrode pads 17 are not directly connected to the clip 9. Therefore, the first electrode pads 17 can be designed without consideration of the size of the clip 9. That is, the first electrode pads 17 can be formed in a proper pattern in conformity with a wiring design rule. As a result, the elongation of the wiring route (e.g., the wiring route of the multilevel wiring structure provided on the silicon substrate) is prevented, thereby suppressing the increase in the resistance of the semiconductor chip 4.

In the semiconductor device 1, the wiring pad openings 32 each provide a space for accommodating the solder 21. When the solder 21 is melted in the step of FIG. 4F, therefore, the solder 21 is effectively prevented from flowing into the wiring region 15 or the signal region 16 disposed adjacent each other.

Figure 5:
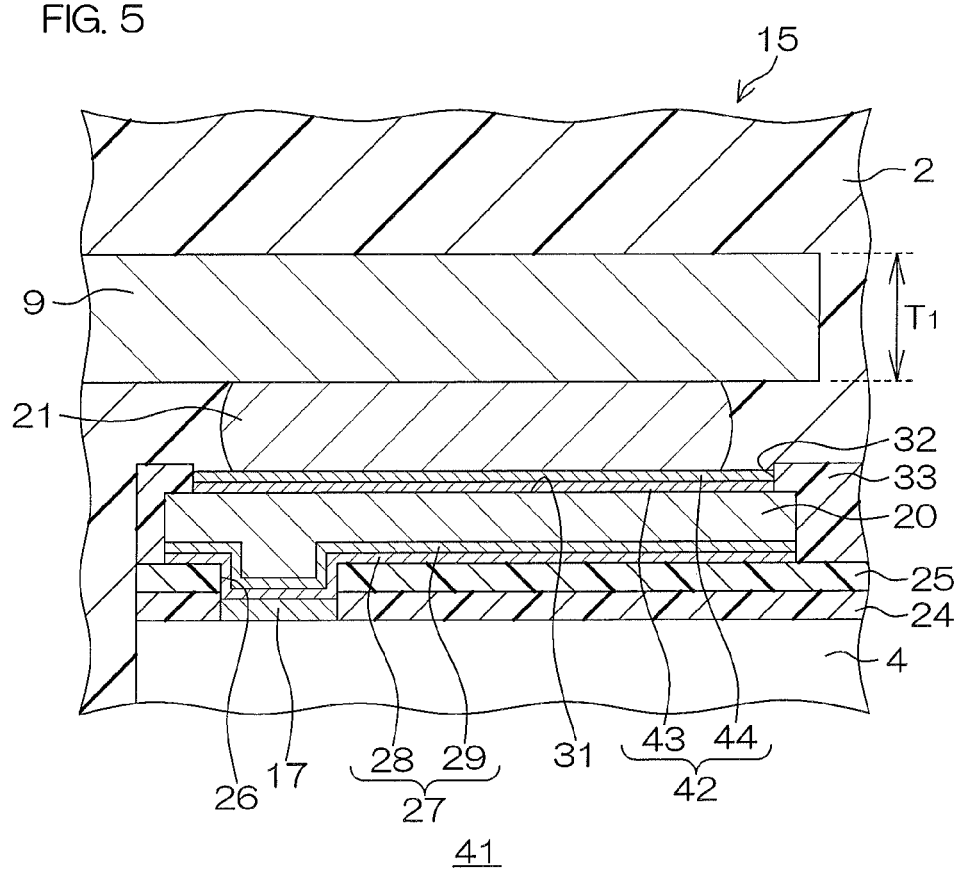
FIG. 5 is a schematic enlarged sectional view showing a wiring region of a semiconductor device according to a second embodiment of the present invention.

FIG. 5 is a schematic enlarged sectional view showing a wiring region 15 of a semiconductor device 41 according to a second embodiment of the present invention.

The semiconductor device 41 of the second embodiment differs from the semiconductor device 1 of the first embodiment in that metal plating films 42 are respectively provided on the wiring pads 31. Except for this arrangement, the semiconductor device 41 has substantially the same construction as the semiconductor device 1 of the first embodiment. In FIG. 5, components corresponding to those shown in FIGS. 1 to 4F are designated by the same reference characters as in FIGS. 1 to 4F, and duplicate description will be omitted.

The metal plating films 42 respectively cover the surfaces of the wiring pads 31 in the wiring pad openings 32. The metal plating films 42 each have a double layer structure including two layers made of different metal materials. The metal plating films 42 each have a Pd plating film 43 containing Pd (palladium) and a Ni plating film 44 containing Ni (nickel), which are provided in this order. The Pd plating film 43 has a thickness of, for example, 0.25 μm, and the Ni plating film 44 has a thickness of, for example, 3.0 μm. In this embodiment, the metal plating films 42 each have the double layer structure by way of example, but may each have a single layer structure including a Ni plating film 44 alone.

The semiconductor device 41 can be produced by additionally performing a plating film forming step of forming the Pd plating film 43 and the Ni plating film 44 in this order over the surfaces of the wiring pads 31 after the step of FIG. 4E before the step of FIG. 4F.

The semiconductor device 41 having the aforementioned construction provides the same effects as in the first embodiment.

Since the metal plating films 42 are respectively provided on the surfaces of the wiring pads 31 in the semiconductor device 41, the wiring pads 31 are improved in wettability with the solder 21. Particularly, where the rewirings 20 are formed of Cu in the step of FIG. 4C, the solder 21 is effectively prevented from infiltrating into the rewirings 20 when the rewirings 20 are connected to the clips 9 in the step of FIG. 4F. This improves the connection strength between the semiconductor chip 4 (wiring pads 31) and the clips 9.

Figure 6:
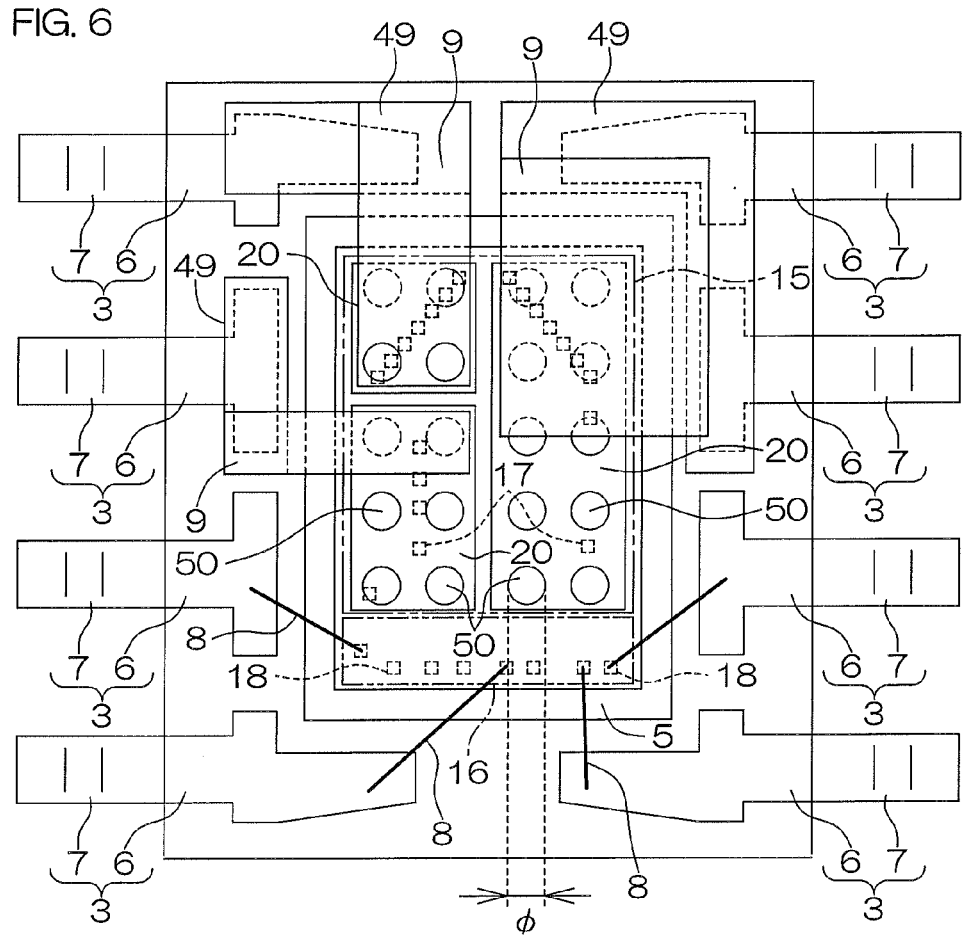
FIG. 6 is a schematic plan view showing the inside of a semiconductor device according to a third embodiment of the present invention.
Figure 7:
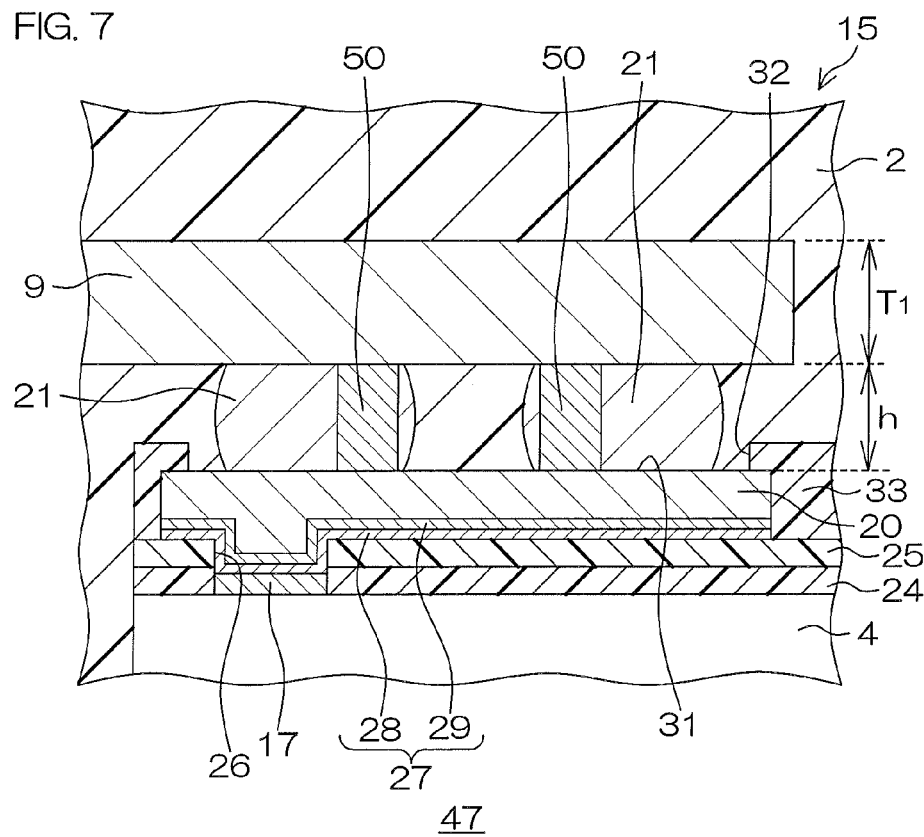
FIG. 7 is a schematic enlarged sectional view showing a wiring region of the semiconductor device shown in FIG. 6.

FIG. 6 is a schematic plan view showing the inside of a semiconductor device 47 according to a third embodiment of the present invention. FIG. 7 is a schematic enlarged sectional view showing a wiring region 15 of the semiconductor device 47 shown in FIG. 6.

The semiconductor device 47 of the third embodiment differs from the semiconductor device 1 of the first embodiment in that the clips 9 are connected to the inner lead portions 6 via metal frames 49, and that a plurality of posts 50 are provided on each of the wiring pads 31. Except for this arrangement, the semiconductor device 47 has substantially the same construction as the semiconductor device 1 of the first embodiment. In FIGS. 6 and 7, components corresponding to those shown in FIGS. 1 to 5 are designated by the same reference characters as in FIGS. 1 to 5, and duplicate description will be omitted.

In this embodiment, as shown in FIG. 6, the metal frames 49, which are made of the same material as the clips 9, are selectively connected to the inner lead portions 6. The metal frames 49 extend along edges of the semiconductor chip 4 to project from some of the leads 3. That is, the metal frames 49 are extensions of the leads 3 extending along the edges of the semiconductor chip 4 from the leads 3. Thus, the metal frames 49 substantially serve as leads provided closer to the edges of the semiconductor chip 4, so that the clips 9 can be disposed along the edges of the semiconductor chip 4 or perpendicularly across the edges of the semiconductor chip 4 to be connected to the rewirings 20. The provision of the metal frames 49 makes it possible to effectively utilize the existing leads and alleviate restriction of the design rule of the clips 9.

In this embodiment, the metal frames 49 are provided separately from the clips 9 by way of example, but may be integrally connected to the clips 9, or may be integrally connected to the inner lead portions 6.

As shown in FIGS. 6 and 7, the columnar posts 50 are provided on the wiring pads 31 as projecting upward of the surface of the rewiring protection film 33.

As shown in FIG. 6, the posts 50 are arrayed on the wiring pads 31. More specifically, the posts 50 are equidistantly spaced in two perpendicular directions to be arranged in a matrix array on the wiring pads 31. In this case, the posts 50 are preferably disposed in regions in which the first electrode pads 17 are absent.

In this embodiment, the posts 50 each have a cylindrical shape having a diameter φ of, for example, 25 μm to 200 μm. The posts 50 have the same height, e.g., a height h of 10 μm to 50 μm. The posts 50 are preferably made of a metal material having a higher hardness than the solder 21, e.g., a Cu-containing metal material.

In this embodiment, two posts 50 are arranged in each row on the wiring pads 31 as seen in plan in FIG. 6, but more than two posts 50 may be arranged in each row on the wiring pads 31 according to the diameters of the posts 50. In this case, a plurality of posts 50 may be arranged in each column at the same pitch. Polygonal columnar posts 50 such as quadratic columnar posts may be provided instead of the cylindrical posts 50. Further, another post 50 may be provided in a region having vertexes defined by four adjacent posts 50.

In this embodiment, the solder 21 connecting the clips 9 to the wiring pads 31 is provided around each of the posts 50, but may be provided around a plurality of posts 50.

FIGS. 8A to 8F are sectional views for explaining an exemplary production process for the semiconductor device 47 shown in FIG. 6.

The production process for the semiconductor device 47 differs from the production process for the semiconductor device 1 of the first embodiment in that the steps of FIGS. 8A to 8F are performed after the step of FIG. 4E. The other steps are the same as those of the production process for the semiconductor device 1 of the first embodiment, and duplicate description will be omitted.

In the production process for the semiconductor device 47 of the third embodiment, as shown in FIG. 8A, a Cu film 64 and a Ti film 65 are formed in this order by plating in the same manner as in the step of forming the UBM film 27 (see FIG. 4B) after the step of FIG. 4E. Thus, a UBM film 52 is formed on the rewiring protection film 33 as covering the wiring pads 31.

In turn, as shown in FIG. 8B, a dry film 53 having openings selectively on regions to be formed with posts 50 is formed on the UBM film 52.

Figure 8C:
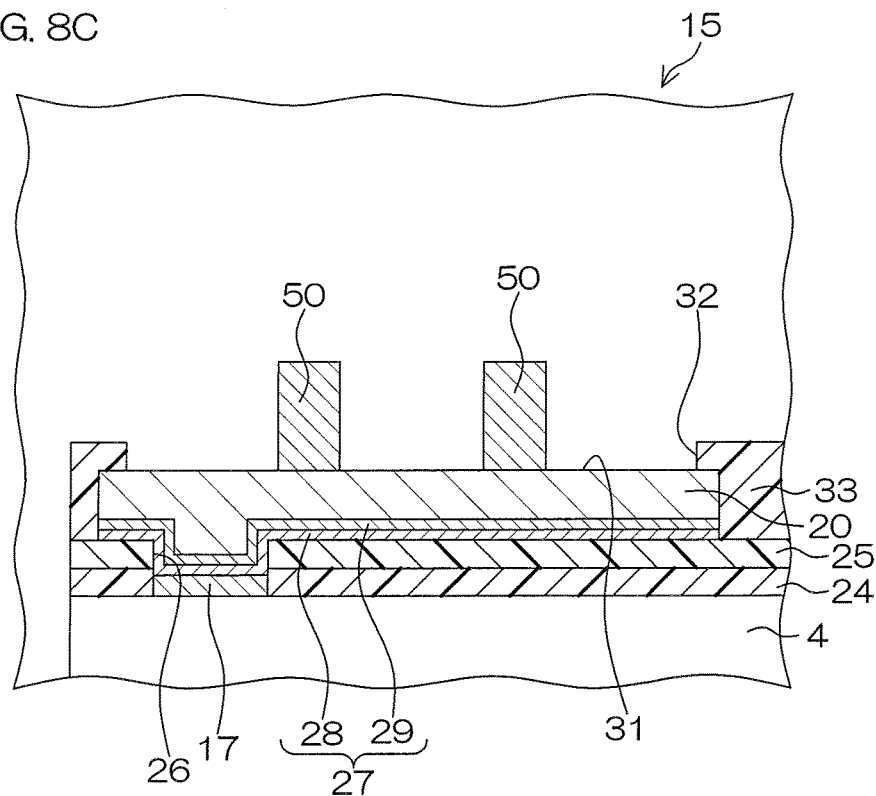

Subsequently, as shown in FIG. 8C, Cu or Al is deposited in the openings of the dry film 53 by plating. Thus, the posts 50 are formed. After the formation of the posts 50, the dry film 53 and the UBM film 52 are removed.

Figure 8D:
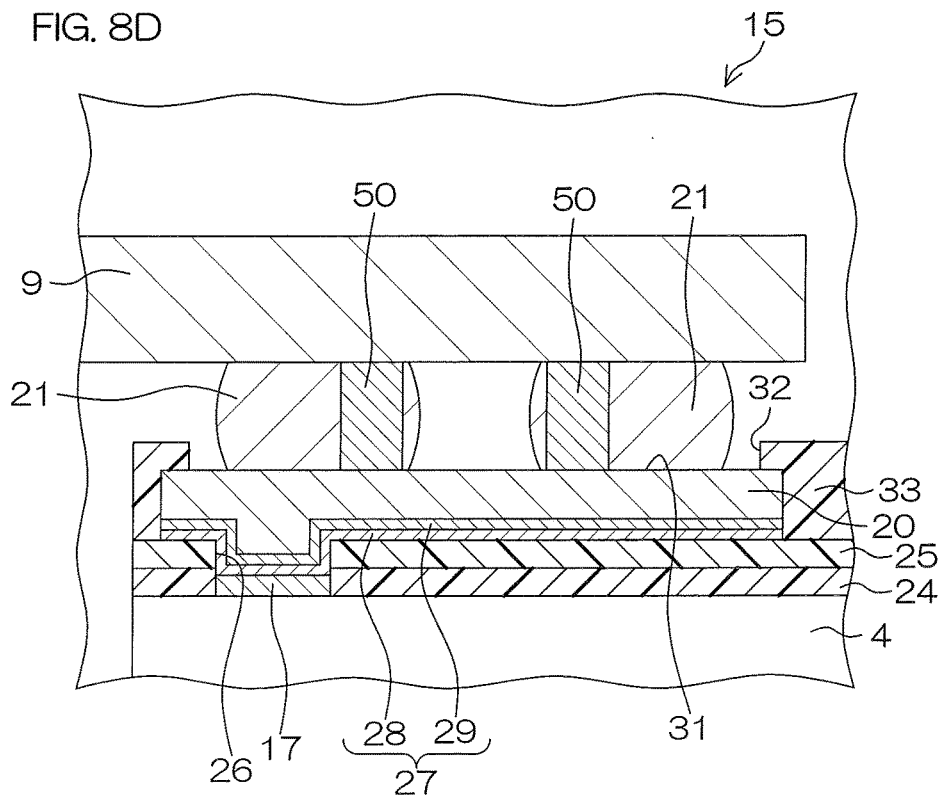

Then, as shown in FIG. 8D, solder balls (solder 21), for example, are formed in the wiring pad openings 32. In turn, the semiconductor chip 4 is mounted on the island 5 in an attitude such that the surface of the semiconductor chip 4 on which the wiring region 15 and the signal region 16 are defined faces up. Subsequently, the wiring pads 31 and the second electrode pads 18 are respectively connected to the inner lead portions 6 via the clips 9 connected to the metal frames 49 and the bonding wires 8. At this time, the connection between the rewirings 20 and the clips 9 can be easily achieved with the use of the solder 21.

Thereafter, the semiconductor chip 4, the island 5, the inner lead portions 6, the clips 9, the bonding wires 8 and the like are sealed in the epoxy resin. Thus, the semiconductor device 47 shown in FIGS. 6 and 7 is produced.

The semiconductor device 47 having the aforementioned construction provides the same effects as in the first embodiment.

In the semiconductor device 47, the clips 9 are connected to the wiring pads 31 via the posts 50 having the same height h and the solder 21. Thus, the clips 9 are effectively prevented from being inclined when being connected to the wiring pads 31. The posts 50 absorb thermal stress occurring when the solder 21 is melted. Therefore, the rewirings 20, the clips 9 and the like are effectively prevented from being influenced by the thermal stress. This further improves the connection strength between the semiconductor chip 4 (wiring pads 31) and the clips 9.

Figure 9:
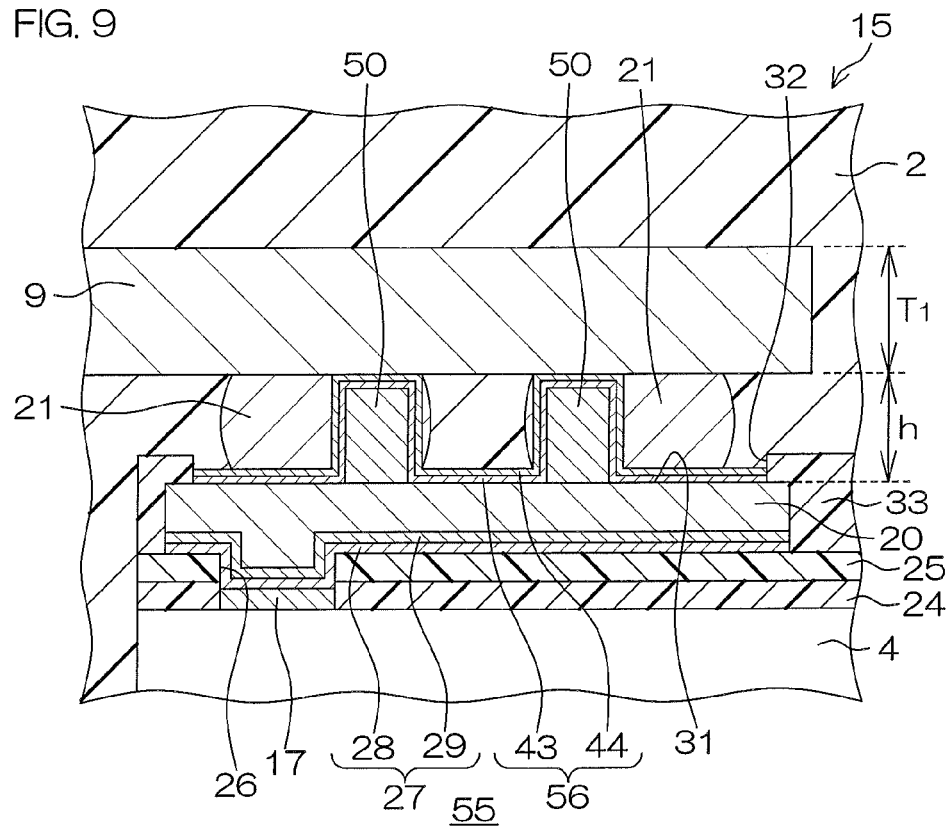
FIG. 9 is a schematic enlarged sectional view showing a wiring region of a semiconductor device according to a fourth embodiment of the present invention.

FIG. 9 is a schematic enlarged sectional view showing a wiring region of a semiconductor device 55 according to a fourth embodiment of the present invention.

The semiconductor device 55 of the fourth embodiment differs from the semiconductor device 47 of the third embodiment in that metal plating films 56 cover the wiring pads 31 and the posts 50. Except for this arrangement, the semiconductor device 55 has substantially the same construction as the semiconductor device 47 of the third embodiment. In FIG. 9, components corresponding to those shown in FIGS. 1 to 8D are designated by the same reference characters as in FIGS. 1 to 8D, and duplicate description will be omitted.

The metal plating films 56 of the semiconductor device 55 each have the same structure as the metal plating films 42 of the second embodiment. The metal plating films 56 are formed through the following step. The step of forming a Pd plating film 43 and a Ni plating film 44 to selectively cover the wiring pads 31 and the posts 50 is additionally performed in the same manner as the step of forming the metal plating films 42 of the second embodiment after the step of FIG. 8C before the step of FIG. 8D, whereby the semiconductor device 55 is produced.

The semiconductor device 55 having the aforementioned construction provides the same effects as in the first to third embodiments.

In the semiconductor device 55, the posts 50 are covered with the metal plating films 56 and, therefore, improved in wettability with the solder 21. Further, the solder 21 is effectively prevented from infiltrating into the posts 50 when the posts 50 are connected to the clips 9. This further improves the connection strength between the posts 50 and the clips 9.

Figure 10:
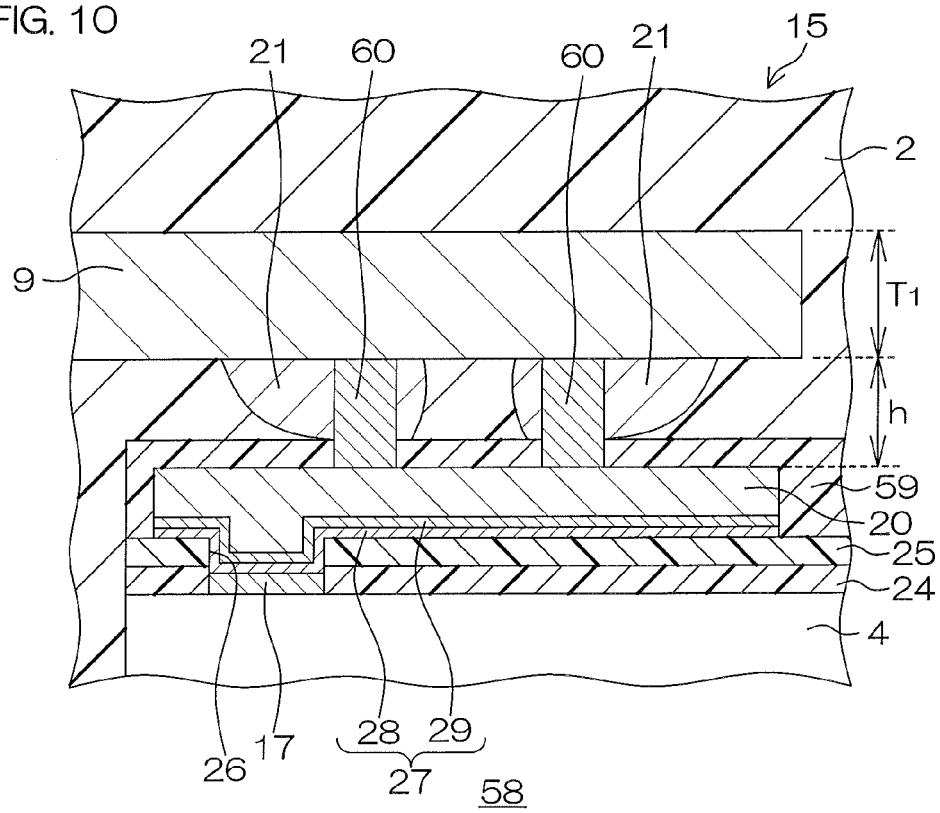
FIG. 10 is a schematic enlarged sectional view showing a wiring region of a semiconductor device according to a fifth embodiment of the present invention.

FIG. 10 is a schematic enlarged sectional view showing a wiring region 15 of a semiconductor device 58 according to a fifth embodiment of the present invention.

The semiconductor device 58 of the fifth embodiment differs from the semiconductor device 47 of the third embodiment in that a rewiring protection film 59 covering the rewirings 20 is provided instead of the rewiring protection film 33, and that posts 60 extend through the rewiring protection film 59 to be connected to the rewirings 20. Except for this arrangement, the semiconductor device 58 has substantially the same construction as the semiconductor device 47 of the third embodiment. In FIG. 10, components corresponding to those shown in FIGS. 1 to 9 are designated by the same reference characters as in FIGS. 1 to 9, and duplicate description will be omitted.

The posts 60 of the semiconductor device 58 each have the same structure and are arranged in the same manner as the posts 50 of the third embodiment. The posts 60 are formed through the following step. After the rewiring protection film 59 is formed as covering the entire rewirings 20 in the step of FIG. 4E, a dry film having openings selectively on regions to be formed with the posts 60 is formed as covering the rewiring protection film 59 in the same manner as in the step of FIG. 8B. At this time, the openings extend through the rewiring protection film 59 to the rewirings 20. Then, Cu is deposited in the openings by plating in the same manner as in the step of FIG. 8C. Thus, the posts 60 are formed which extend through the rewiring protection film 59 to be connected to the rewirings 20.

The semiconductor device 58 having the aforementioned construction provides the same effects as in the third embodiment.

Figure 11:
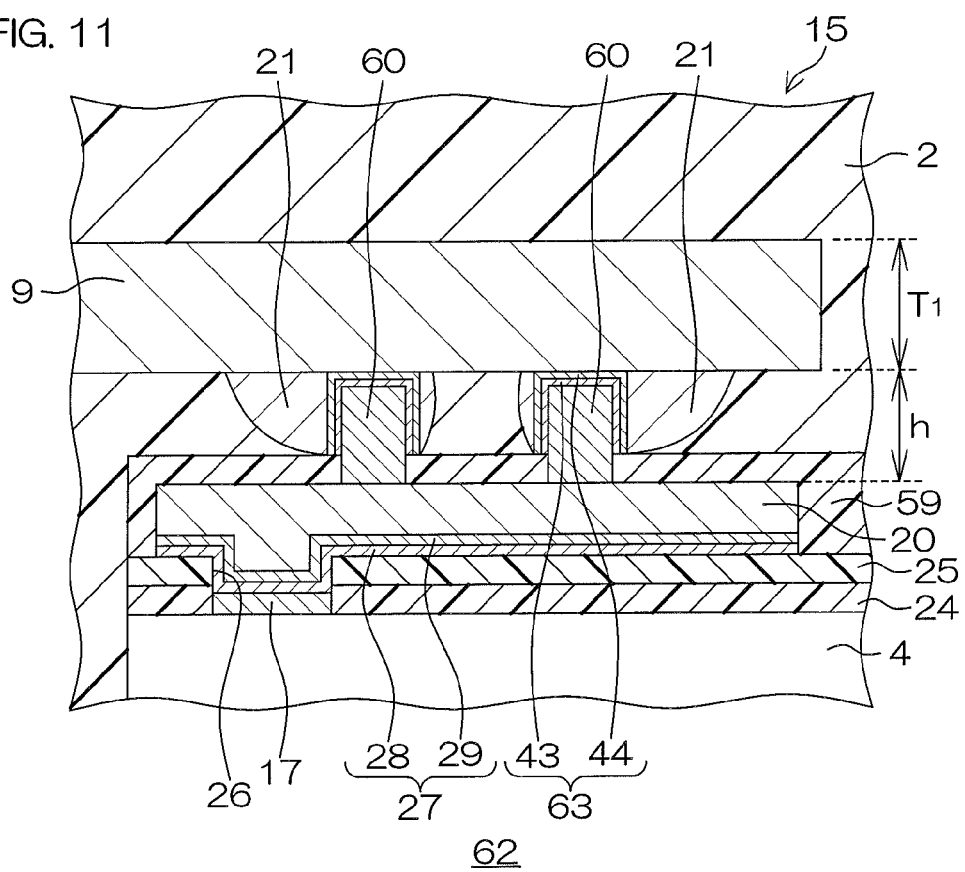
FIG. 11 is a schematic enlarged sectional view showing a wiring region of a semiconductor device according to a sixth embodiment of the present invention.

FIG. 11 is a schematic enlarged sectional view showing a wiring region 15 of a semiconductor device 62 according to a sixth embodiment of the present invention.

The semiconductor device 62 of the sixth embodiment differs from the semiconductor device 58 of the fifth embodiment in that metal plating films 63 are provided to cover portions of the posts 60 projecting from the rewiring protection film 59. Except for this arrangement, the semiconductor device 62 has substantially the same construction as the semiconductor device 58 of the fifth embodiment. In FIG. 11, components corresponding to those shown in FIGS.

1 to 10 are designated by the same reference characters as in FIGS. 1 to 10, and duplicate description will be omitted.

The metal plating films 63 of the semiconductor device 62 each have the same structure as the metal plating films 42 of the second embodiment. The metal plating films 63 are formed through the following step. The step of forming a Pd plating film 43 and a Ni plating film 44 to cover the portions of the posts 60 projecting from the rewiring protection film 59 is additionally performed after the formation of the posts 60 in the fifth embodiment, whereby the semiconductor device 62 is produced.

The semiconductor device 62 having the aforementioned construction provides the same effects as in the third embodiment.

In the semiconductor device 62, the portions of the posts 60 projecting from the rewiring protection film 59 are respectively covered with the metal plating films 63 and, therefore, improved in wettability with the solder 21. Thus, the solder 21 is effectively prevented from infiltrating into the posts 60 when the posts 60 are connected to the clips 9. This improves the connection strength between the posts 60 and the clips 9.

Figure 12:
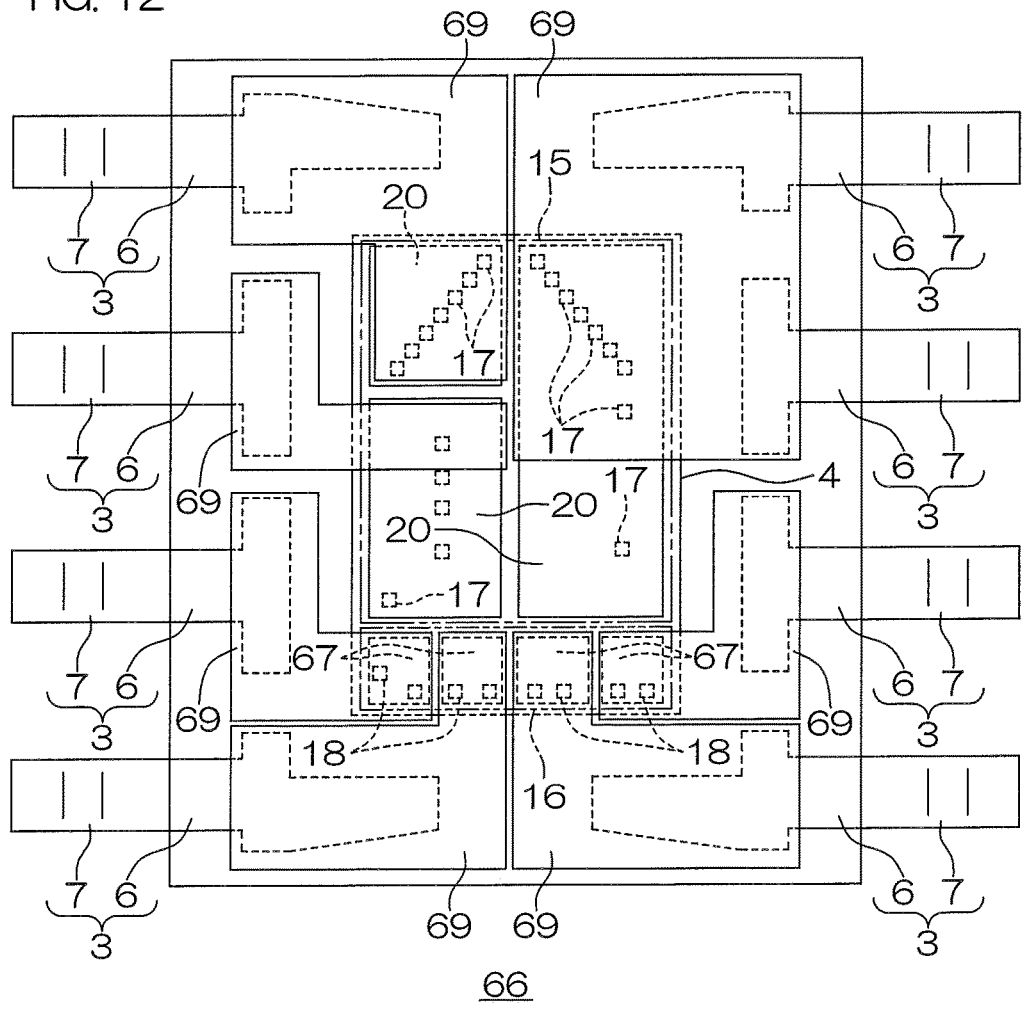
FIG. 12 is a schematic plan view showing the inside of a semiconductor device according to a seventh embodiment of the present invention.
Figure 13:
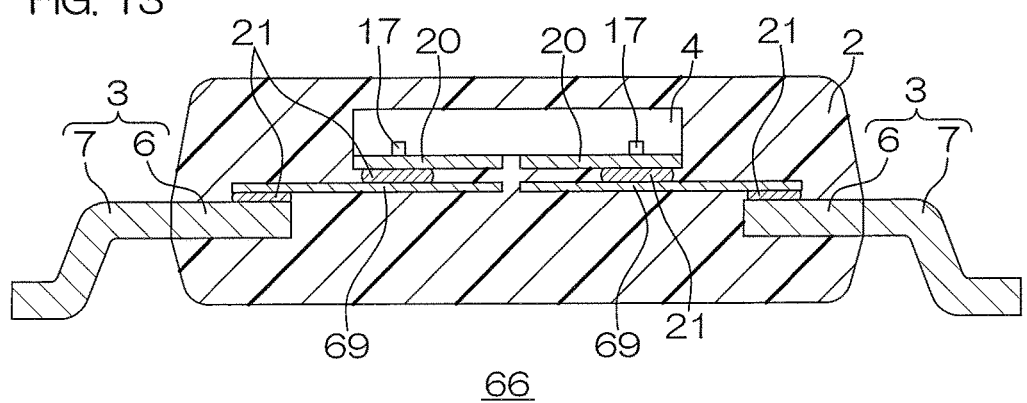
FIG. 13 is a schematic sectional view of the semiconductor device shown in FIG. 12.

FIG. 12 is a schematic plan view showing the inside of a semiconductor device 66 according to a seventh embodiment of the present invention. FIG. 13 is a schematic sectional view of the semiconductor device 66 shown in FIG. 12.

The semiconductor device 66 of the seventh embodiment differs from the semiconductor device 1 of the first embodiment in that wiring plates (another example of the connection member (electrically conductive plate) in the present invention) are connected to the inner lead portions 6, that signal region rewirings 67 are provided in the signal region 16, that a rewiring protection film 72 selectively covering the wiring region 15 and the signal region 16 is provided instead of the rewiring protection film 33, and that the semiconductor chip 4 is connected to the wiring plates 69 through flip-chip connection. Except for this arrangement, the semiconductor device 66 has substantially the same construction as the semiconductor device 1 of the first embodiment. In FIGS. 12 to 14B, components corresponding to those shown in FIGS. 1 to 11 are designated by the same reference characters as in FIGS. 1 to 11, and duplicate description will be omitted.

In this embodiment, as shown in FIGS. 12 and 13, the semiconductor chip 4 is connected to the wiring plates 69 through flip-chip connection in an attitude such that the surface thereof on which the wiring region 15 and the signal region 16 are defined faces down. The signal region rewirings 67 are provided on the signal region 16 of the semiconductor chip 4.

In this embodiment, the signal region rewirings 67 include four signal region rewirings 67 having different areas. The signal region rewirings 67 each cover a plurality of second electrode pads 18, which are disposed therebelow and electrically connected together thereto. The signal region rewirings 67 each have a generally rectangular shape as seen in plan. The signal region rewirings 67 are exposed on the outermost surface of the semiconductor chip 4, and each have an exposed surface area greater than the total area of the second electrode pads 18. The signal region rewirings 67 are disposed in spaced relation in the signal region 16, and electrically isolated from each other. Thus, different voltages independent of each other can be applied to the respective signal region rewirings 67.

The number of the signal region rewirings 67 may be changed, as required, according to the use purposes of the signal elements, the voltages to be applied to the signal elements, and the like. Therefore, only one signal region rewiring 67 may be provided in the signal region 16, or four or more signal region rewirings 67 may be provided in the signal region 16.

The wiring plates 69 are connected to the inner lead portions 6, the rewirings 20 and the signal region rewirings 67 via the solder 21. The wiring plates 69 each include, for example, a plurality of rectangular metal plates combined together into a polygonal shape. Like the clips 9 of the first embodiment, the wiring plates 69 preferably each have a surface area of 0.25 mm$^2$ (which is equivalent to a square size of 0.5 mm×0.5 mm) as seen in plan in FIG. 12.

Figure 14A:
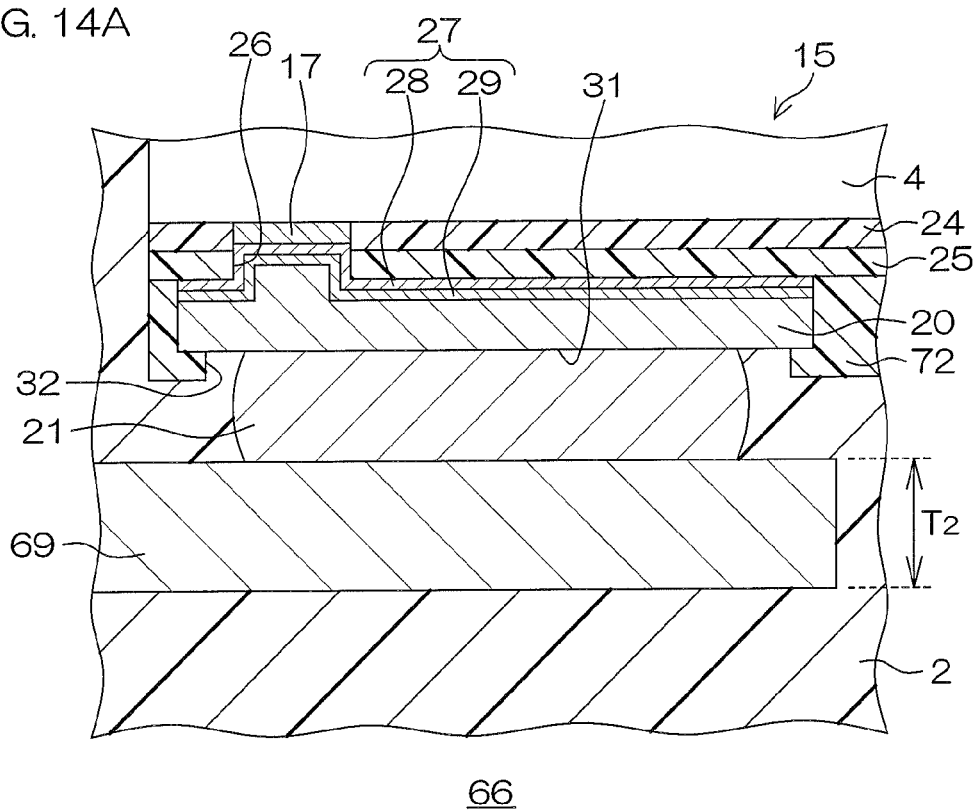
FIG. 14A is a schematic enlarged sectional view of a wiring region shown in FIG. 12.
Figure 14B:
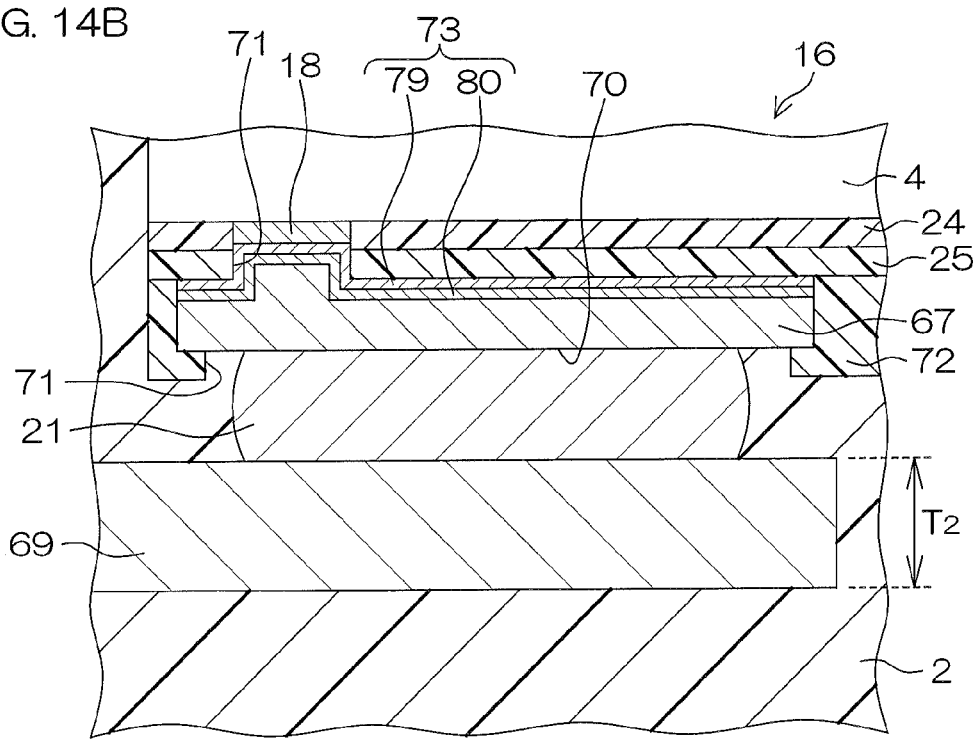
FIG. 14B is a schematic enlarged sectional view of a signal region shown in FIG. 12.

Referring to FIGS. 14A and 14B, the specific construction of the semiconductor chip 4 will next be described. FIG. 14A is a schematic sectional view of the wiring region 15 shown in FIG. 12. FIG. 14B is a schematic sectional view of the signal region 16 shown in FIG. 12.

The wiring region 15 of the seventh embodiment has substantially the same structure as the wiring region 15 of the first embodiment, as shown in FIG. 14A, except that the rewiring protection film 72 is provided instead of the rewiring protection film 33 as having wiring pad openings 32 through which parts of the surfaces of the rewirings 20 are selectively exposed, and that the wiring pads 31 are connected to the wiring plates 69 via the solder 21 through flip-chip connection.

In the signal region 16, as shown in FIG. 14B, the rewiring protection film 72 is provided as having signal region wiring pad openings 71 through which parts of the signal region rewirings 67 are selectively exposed as signal region wiring pads 70. Then, the signal region wiring pads 70 are connected to the wiring plates 69 via the solder 21 through flip-chip connection.

In the signal region 16, the second electrode pads 18 are electrically connected to the signal region rewirings 67 via signal region UBM films 73.

As shown in FIG. 14B, the signal region UBM films 73 are provided on the surface of the protection film 25, the inner surfaces of the second pad openings 34 and the surfaces of the second electrode pads 18. In other words, the signal region UBM films 73 each extend from the surface of the protection film 25 into the second pad openings 34 to be electrically connected to the second electrode pads 18 in the second pad openings 73. Further, the signal region UBM films 73 each have the same area as the corresponding signal region rewiring 67 as seen in plan in FIG. 12, and side surfaces of the signal region UBM film 73 are flush with side surfaces of the corresponding signal region rewiring 67. That is, the signal region UBM film 73 is provided on the protection film. 25 to cover the second electrode pads 18 together. The signal region UBM film 73 has a double layer structure including two layers made of different metal materials like the UBM film 27 in the first embodiment. The signal region UBM film 73 includes a Cu-containing Cu film 79 and a Ti-containing Ti film 80 provided in this order on the protection film 25.

The signal region rewirings 67 are each provided along the surface of the signal region UBM film 73. More specifically, the signal region rewiring 67 is provided on the surface of the signal region UBM film 73 with parts thereof entering recesses of the signal region UBM film 73 in the second pad openings 34. Thus, the signal region rewiring 67 is electrically connected to the second electrode pads 18 via the signal region UBM film 73. The signal region rewiring 67 has a thickness of, for example, not less than 3 μm. The signal region rewiring 67 is preferably made of a Cu- or Al-containing metal material.

The rewirings 20 and the signal region rewirings 67 are defined by the rewiring protection film 72 to be thereby electrically isolated from each other. The rewiring protection film 72 is made of, for example, a polyimide. The solder 21 is disposed in the signal region wiring pad openings 71.

The wiring pads 31 (rewirings 20) and the signal region wiring pads 70 (signal region rewirings 67) are connected to the wiring plates 69 via the solder 21. The wiring plates 69 each have a thickness $T_2$ of, for example, 50 μm to 400 μm. The wiring plates 69 are made of, for example, an electrically conductive material containing Cu or the like.

The semiconductor device 66 of the seventh embodiment can be produced simply by changing the layout of the resist mask 35 and the like in the production process (the steps of FIGS. 4A to 4F) for the semiconductor device 1 of the first embodiment.

In the semiconductor device 66, as described above, the first electrode pads 17 are connected together to the corresponding rewiring 20 having an area greater than the total area of the first electrode pads 17, and the second electrode pads 18 are connected together to the corresponding signal region rewiring 67 having an area greater than the total area of the second electrode pads 18. Therefore, the wiring plates 69, which each have an area greater than the total area of the electrode pads 17, 18, can be used as the connection member for supplying electric power to the electrode pads 17, 18. Thus, the resistance between the semiconductor chip 4 and the resin package 2 can be reduced as compared with the case in which the bonding wires 8 are respectively connected to the electrode pads 17, 18.

On the other hand, the electrode pads 17, 18 are not directly connected to the wiring plates 69 and, therefore, can be designed without consideration of the sizes of the wiring plates 69. That is, the electrode pads 17, 18 can be formed in a proper pattern in conformity with the wiring design rule. At a result, the elongation of the wiring route (e.g., the wiring route of the multilevel wiring structure provided on the silicon substrate) is prevented, thereby suppressing the increase in the resistance of the semiconductor chip 4.

In the semiconductor device 66, the wiring pad openings 32 and the signal region wiring pad openings 71 each provide a space for accommodating the solder 21. When the solder 21 is melted for connection between the semiconductor chip 4 and the wiring plates 69, therefore, the solder 21 is effectively prevented from flowing into the wiring region 15 (rewirings 20) and the signal region 16 (signal region rewirings 67) disposed adjacent each other.

FIG. 15 is a schematic enlarged sectional view showing a wiring region 15 of a semiconductor device 74 according to an eighth embodiment of the present invention.

The semiconductor device 74 of the eighth embodiment differs from the semiconductor device 66 of the seventh embodiment in that metal plating films 75 are respectively provided on the wiring pads 31 and the signal region wiring pads 70. Except for this arrangement, the semiconductor device 74 has substantially the same construction as the semiconductor device 66 of the seventh embodiment. In FIG. 15, components corresponding to those shown in FIGS. 1 to 14B are designated by the same reference characters as in FIGS. 1 to 14B, and duplicate description will be omitted. The signal region 16 has substantially the same structure as the wiring region 15 and, therefore, is not illustrated in FIG. 15.

The metal plating films 75 each have the same structure as the metal plating films 42 of the second embodiment.

The semiconductor device 74 having the aforementioned construction provides the same effects as in the seventh embodiment.

Where the rewirings 20 and the signal region rewirings 67 are each made of Cu, the solder 21 is effectively prevented from infiltrating into the rewirings 20 and the signal region rewirings 67 when the rewirings 20 and the signal region rewirings 67 are connected to the wiring plates 69. This improves the connection strength between the semiconductor chip 4 and the wiring plates 69.

Figure 16:
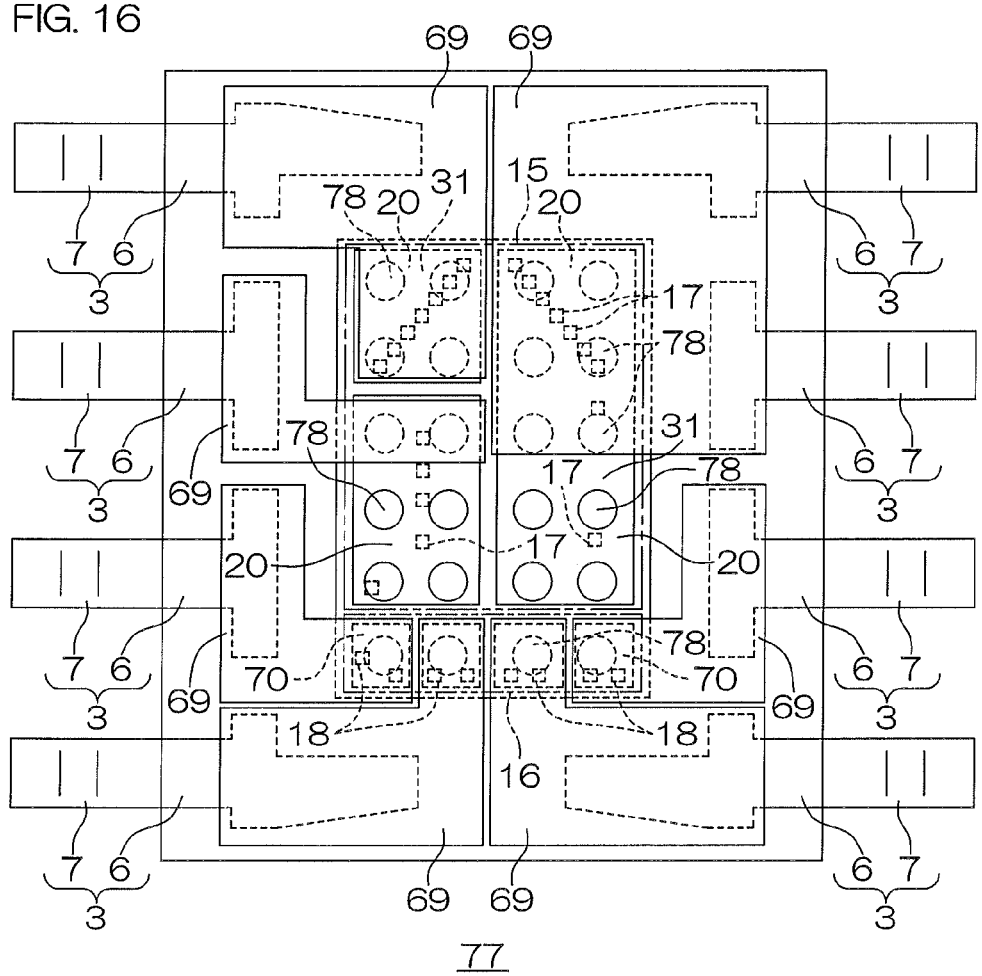
FIG. 16 is a schematic plan view showing the inside of a semiconductor device according to a ninth embodiment of the present invention.
Figure 17:
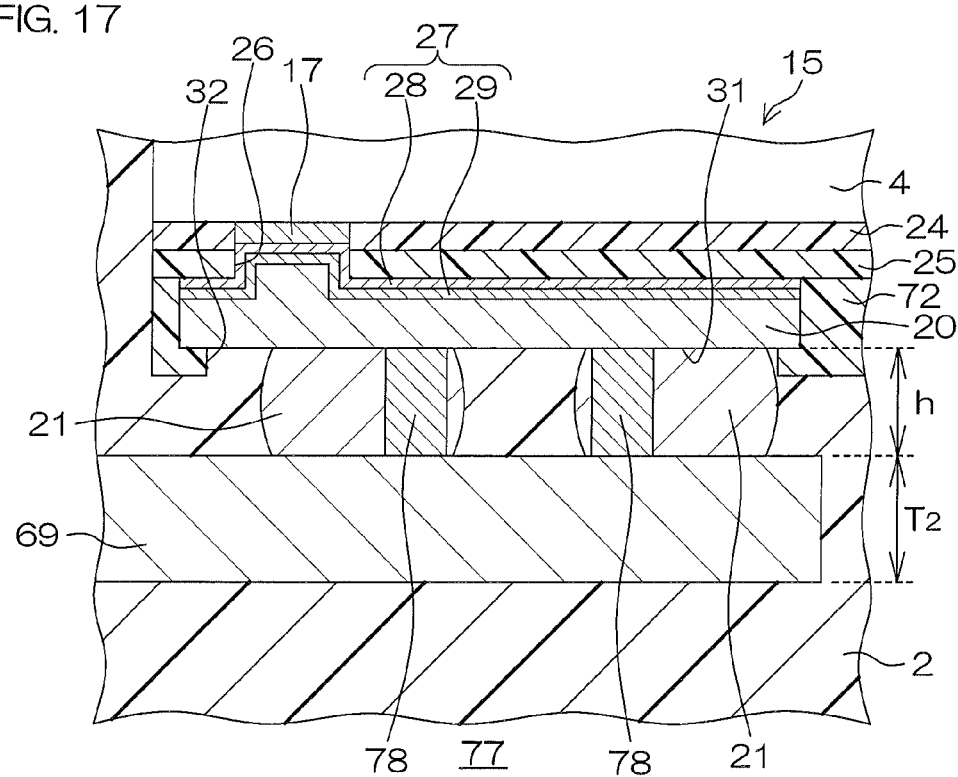
FIG. 17 is a schematic enlarged sectional view showing a wiring region of the semiconductor device shown in FIG. 16.

FIG. 16 is a schematic plan view showing the inside of a semiconductor device 77 according to a ninth embodiment of the present invention. FIG. 17 is a schematic enlarged sectional view showing a wiring region 15 of the semiconductor device 77 shown in FIG. 16.

The semiconductor device 77 of the ninth embodiment differs from the semiconductor device 66 of the seventh embodiment in that a plurality of posts 78 are provided on the wiring pads 31 and the signal region wiring pads 70. Except for this arrangement, the semiconductor device 77 has substantially the same construction as the semiconductor device 66 of the seventh embodiment. In FIGS. 16 and 17, components corresponding to those shown in FIGS. 1 to 15 are designated by the same reference characters as in FIGS. 1 to 15, and duplicate description will be omitted.

According to the ninth embodiment, as shown in FIGS. 16 and 17, the posts 78 are provided on the wiring pads 31 and the signal region wiring pads 70 as projecting from the surfaces of the wiring pads 31 and the surfaces of the signal region wiring pads 70 upward of the surface of the rewiring protection film 72. The posts 78 each have the same structure and are arranged in the same manner as the posts 50 of the third embodiment. In this embodiment, a single post 78 is provided in each of the signal region wiring pads 70 by way of example, but two or more posts 78 may be provided in each of the signal region wiring pads 70 according to the diameter of the posts 78.

The semiconductor device 77 having the aforementioned construction provides the same effects as in the seventh embodiment.

In the semiconductor device 77, the semiconductor chip 4 is connected to the wiring plates 69 via the posts 78 having the same height h and the solder 21. Thus, the wiring pads 31 and the signal region wiring pads 70 are effectively prevented from being misaligned with the wiring plates 69 when being connected to the wiring plates 69, and the semiconductor chip 4 is effectively prevented from being inclined when being connected. That is, the semiconductor device 77 of this arrangement ensures proper self-alignment and proper leveling.

Since thermal stress occurring when the solder 21 is melted can be absorbed by the posts 78, the rewirings 20, the wiring plates 69 and the like are effectively prevented from being influenced by the thermal stress. This further improves the connection strength between the semiconductor chip 4 (the wiring pads 31 and the signal region wiring pads 70) and the wiring plates 69.

Figure 18:
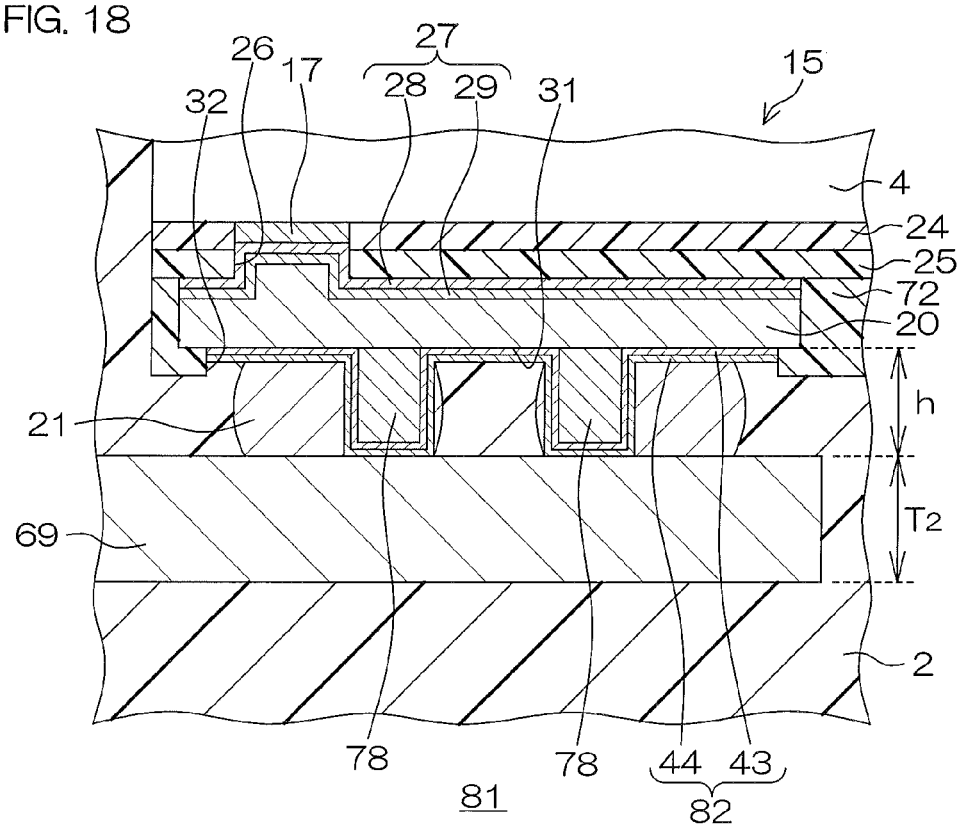
FIG. 18 is a schematic enlarged sectional view showing a wiring region of a semiconductor device according to a tenth embodiment of the present invention.

FIG. 18 is a schematic enlarged sectional view showing a wiring region 15 of a semiconductor device 81 according to a tenth embodiment of the present invention.

The semiconductor device 81 of the tenth embodiment differs from the semiconductor device 77 of the ninth embodiment in that metal plating films 82 selectively cover the wiring pads 31, the signal region wiring pads 70 and the posts 78. Except for this arrangement, the semiconductor device 81 has substantially the same construction as the semiconductor device 77 of the ninth embodiment. In FIG. 18, components corresponding to those shown in FIGS. 1 to 17 are designated by the same reference characters as in FIGS. 1 to 17, and duplicate description will be omitted.

The metal plating films 82 of the semiconductor device 81 each have the same structure as the metal plating films 42 of the second embodiment.

The semiconductor device 81 having the aforementioned construction provides the same effects as in the seventh to ninth embodiments.

In the semiconductor device 81, the wiring pads 31, the signal region wiring pads 70 and the posts 78 are covered with the metal plating films 82 and, therefore, improved in wettability with the solder 21. Thus, the solder 21 is effectively prevented from infiltrating into the wiring pads 31, the signal region wiring pads 70 and the posts 78 when the posts 78 are connected to the wiring plates 69. This improves the connection strength between the semiconductor chip 4 and the wiring plates 69.

Figure 19:
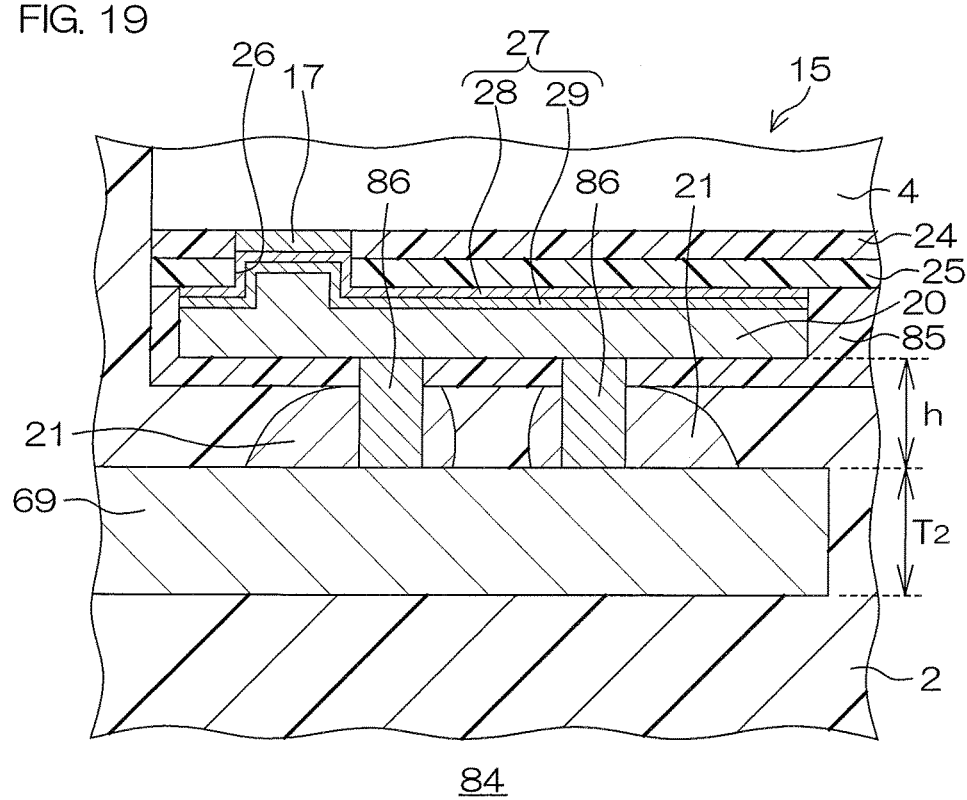
FIG. 19 is a schematic enlarged sectional view showing a wiring region of a semiconductor device according to an eleventh embodiment of the present invention.

FIG. 19 is a schematic enlarged sectional view showing a wiring region 15 of a semiconductor device 84 according to an eleventh embodiment of the present invention.

The semiconductor device 84 of the eleventh embodiment differs from the semiconductor device 77 of the ninth embodiment in that a rewiring protection film 85 covering the rewirings 20 and the signal region rewirings 67 is provided instead of the rewiring protection film 72, and that posts 86 extend through the rewiring protection film 85 to be connected to the wiring pads 31 in the wiring region 15 and to the signal region wiring pads 70 in the signal region 16. Except for this arrangement, the semiconductor device 84 has substantially the same construction as the semiconductor device 77 of the ninth embodiment. In FIG. 19, components corresponding to those shown in FIGS. 1 to 18 are designated by the same reference characters as in FIGS. 1 to 18, and duplicate description will be omitted.

The semiconductor device 84 having the aforementioned construction provides the same effects as in the ninth embodiment.

Figure 20:
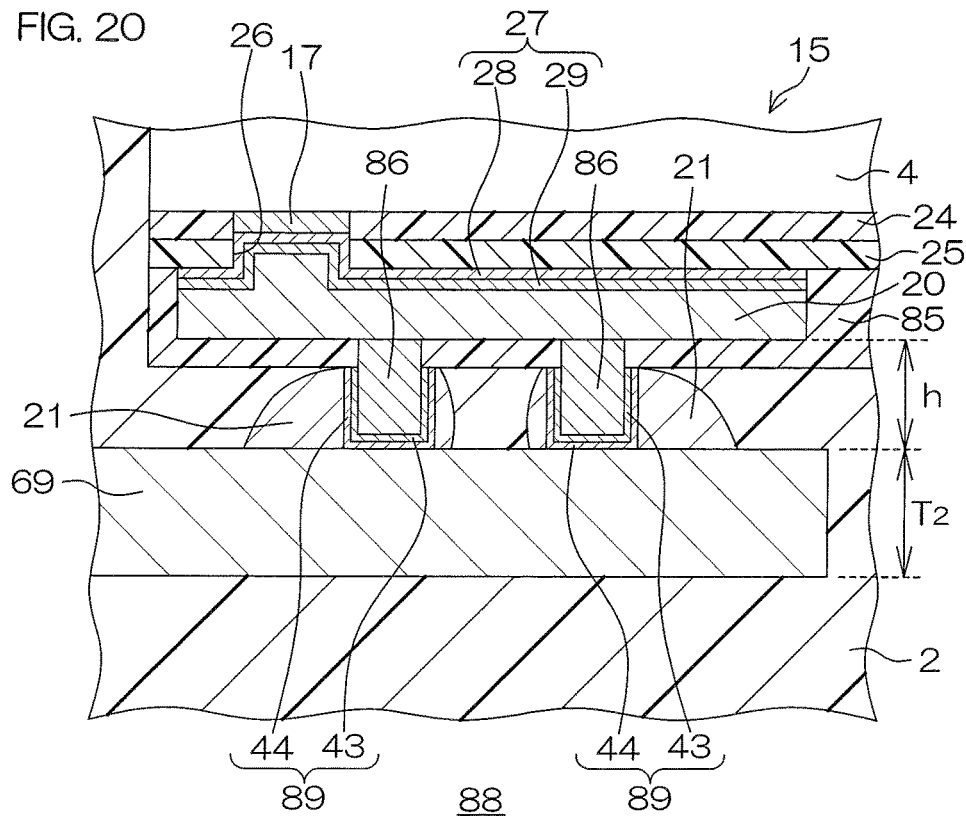
FIG. 20 is a schematic enlarged sectional view showing a wiring region of a semiconductor device according to a twelfth embodiment of the present invention.

FIG. 20 is a schematic enlarged sectional view showing a wiring region 15 of a semiconductor device 88 according to a twelfth embodiment of the present invention.

The semiconductor device 88 of the twelfth embodiment differs from the semiconductor device 84 of the eleventh embodiment in that metal plating films 89 respectively cover portions of the posts 86 projecting from the rewiring protection film 85. Except for this arrangement, the semiconductor device 88 has substantially the same construction as the semiconductor device 84 of the eleventh embodiment. In FIG. 20, components corresponding to those shown in FIGS. 1 to 19 are designated by the same reference characters as in FIGS. 1 to 19, and duplicate description will be omitted.

The metal plating films 89 of the semiconductor device 88 each have the same structure as the metal plating films 42 of the second embodiment.

The semiconductor device 88 having the aforementioned construction provides the same effects as in the ninth embodiment.

In the semiconductor device 88, the portions of the posts 86 projecting from the rewiring protection film 85 are respectively covered with the metal plating films 89 and, therefore, improved in wettability with the solder 21. Thus, the solder 21 is effectively prevented from infiltrating into the posts 86 when the posts 86 are connected to the wiring plates 69. This improves the connection strength between the semiconductor chip 4 and the wiring plates 69.

Figure 21:
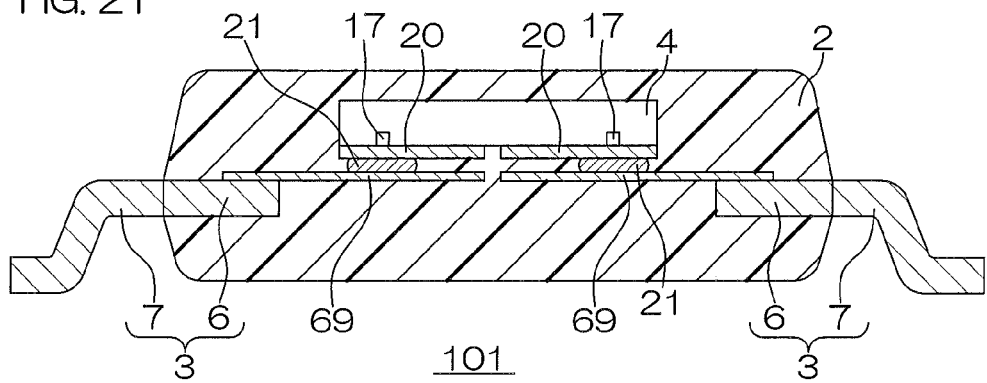
FIG. 21 is a schematic sectional view of a semiconductor device according to a thirteenth embodiment of the present invention.
Figure 22:
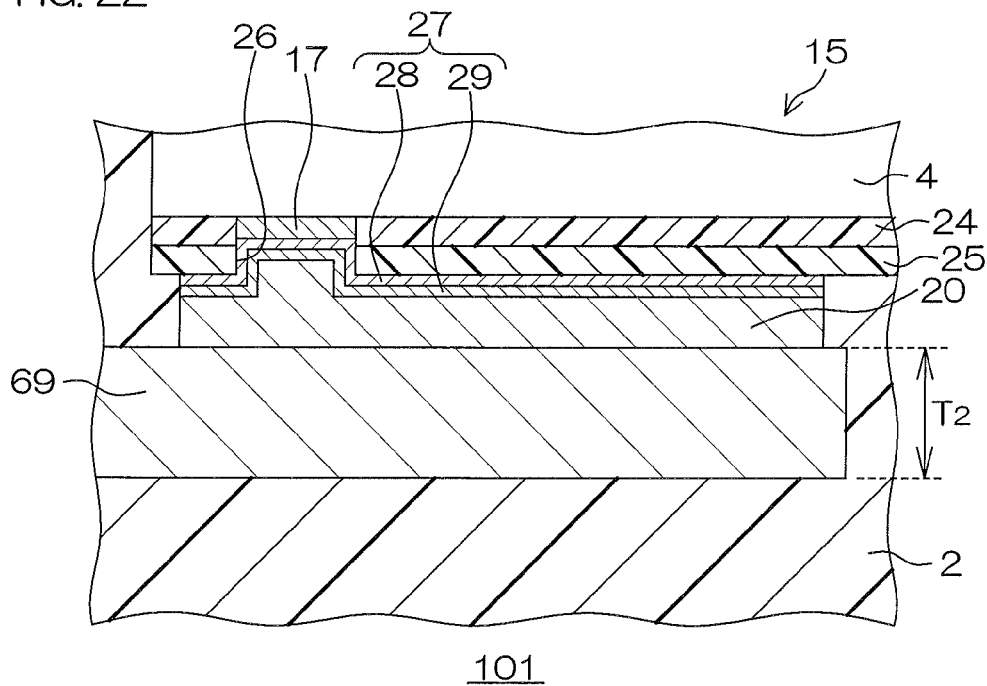
FIG. 22 is a schematic enlarged sectional view of a wiring region shown in FIG. 21.

FIG. 21 is a schematic sectional view of a semiconductor device 101 according to a thirteenth embodiment of the present invention. FIG. 22 is a schematic enlarged sectional view of a wiring region 15 shown in FIG. 21.

The semiconductor device 101 of the thirteenth embodiment differs from the semiconductor device 66 of the seventh embodiment in that the rewiring protection film 72 is not provided, and that the semiconductor chip 4 is connected to the wiring plates 69 without the intervention of the solder 21 through flip-chip connection. Except for this arrangement, the semiconductor device 101 has substantially the same construction as the semiconductor device 66 of the seventh embodiment. In FIG. 21, components corresponding to those shown in FIGS. 1 to 20 are designated by the same reference characters as in FIGS. 1 to 20, and duplicate description will be omitted.

In the semiconductor device 101, as described above, the rewirings 20 each having a greater area than the total area of the first electrode pads 17 are each connected to the first electrode pads 17, and the signal region rewirings 67 each having a greater area than the total area of the second electrode pads 18 are each connected to the second electrode pads 18. Therefore, the wiring plates 69, which each have an area greater than the total area of the electrode pads 17, 18, can be used as the connection member for supplying electric power to the electrode pads 17, 18. Thus, the resistance between the semiconductor chip 4 and the resin package 2 can be reduced as compared with the case in which the bonding wires 8 are respectively connected to the electrode pads 17, 18.

On the other hand, the electrode pads 17, 18 are not directly connected to the wiring plates 69 and, therefore, can be designed without consideration of the sizes of the wiring plates 69. That is, the electrode pads 17, 18 can be formed in a proper pattern in conformity with the wiring design rule. As a result, the elongation of the wiring route (e.g., the wiring route of the multilevel wiring structure provided on the silicon substrate) is prevented, thereby suppressing the increase in the resistance of the semiconductor chip 4.

In the semiconductor device 101, the semiconductor chip 4 is connected directly to the wiring plates 69 without the intervention of the solder 21 through flip-chip connection. This simplifies the production process.

Figure 23:
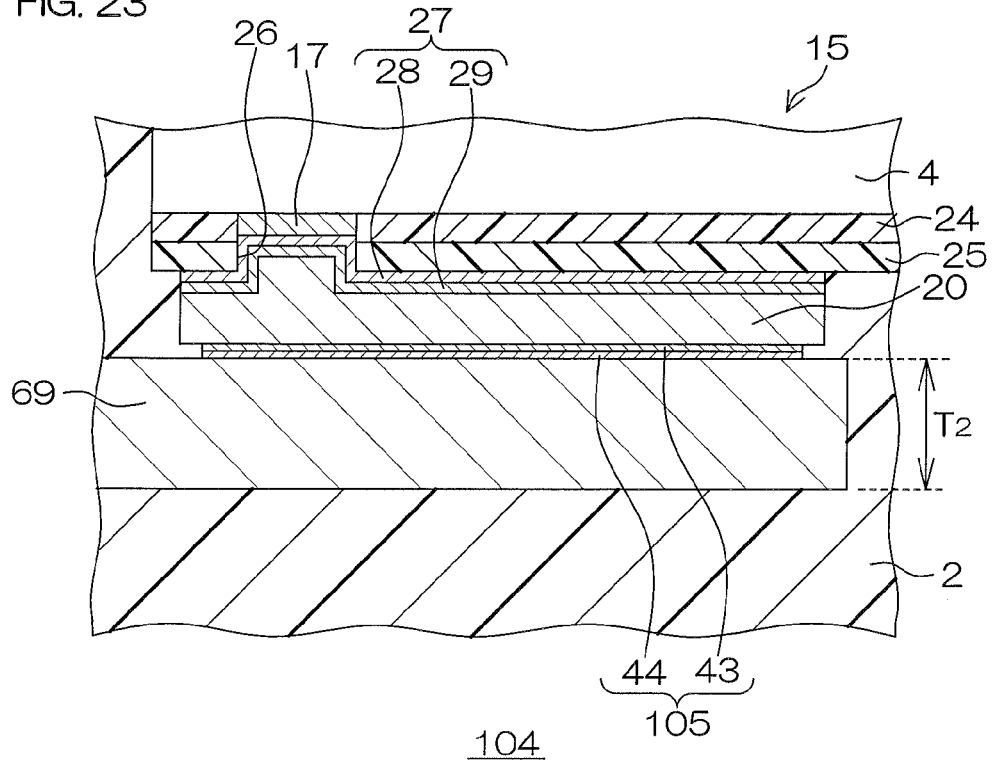
FIG. 23 is a schematic enlarged sectional view showing a wiring region of a semiconductor device according to a fourteenth embodiment of the present invention.

FIG. 23 is a schematic enlarged sectional view showing a wiring region 15 of a semiconductor device 104 according to a fourteenth embodiment of the present invention.

The semiconductor device 104 of the fourteenth embodiment differs from the semiconductor device 74 of the eighth embodiment in that the rewiring protection film 72 is not provided, and that the semiconductor chip 4 is directly connected to the wiring plates 69 via the metal plating films 105 through flip-chip connection. Except for this arrangement, the semiconductor device 104 has substantially the same construction as the semiconductor device 74 of the eighth embodiment. In FIG. 23, components corresponding to those shown in FIGS. 1 to 22 are designated by the same reference characters as in FIGS. 1 to 22, and duplicate description will be omitted.

The semiconductor device 104 having the aforementioned construction provides the same effects as in the thirteenth embodiment.

Figure 24:
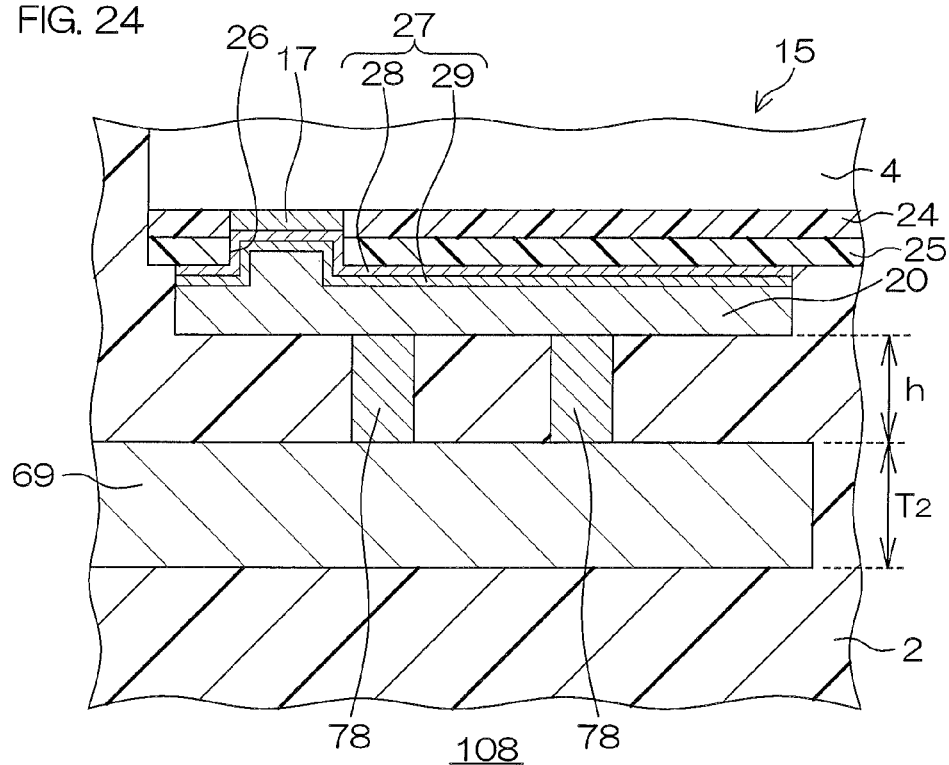
FIG. 24 is a schematic enlarged sectional view showing a wiring region of a semiconductor device according to a fifteenth embodiment of the present invention.

FIG. 24 is a schematic enlarged sectional view showing a wiring region 15 of a semiconductor device 108 according to a fifteenth embodiment of the present invention.

The semiconductor device 108 of the fifteenth embodiment differs from the semiconductor device 77 of the ninth embodiment in that the rewiring protection film 72 is not provided, and that the semiconductor chip 4 is directly connected to the wiring plates 69 via the posts 78 through flip-chip connection. Except for this arrangement, the semiconductor device 108 has substantially the same construction as the semiconductor device 77 of the ninth embodiment. In FIG. 24, components corresponding to those shown in FIGS. 1 to 23 are designated by the same reference characters as in FIGS. 1 to 23, and duplicate description will be omitted.

The semiconductor device 108 having the aforementioned construction provides the same effects as in the thirteenth embodiment.

In the semiconductor device 108, the semiconductor chip 4 is connected to the wiring plates 69 via the posts 78 having the same height h. Thus, the wiring pads 31 and the signal region wiring pads 70 are effectively prevented from being misaligned with the wiring plates 69 when being connected to the wiring plates 69, and the semiconductor chip 4 is effectively prevented from being inclined when being connected. That is, the semiconductor device 108 of this arrangement ensures proper self-alignment and proper leveling.

Figure 25:
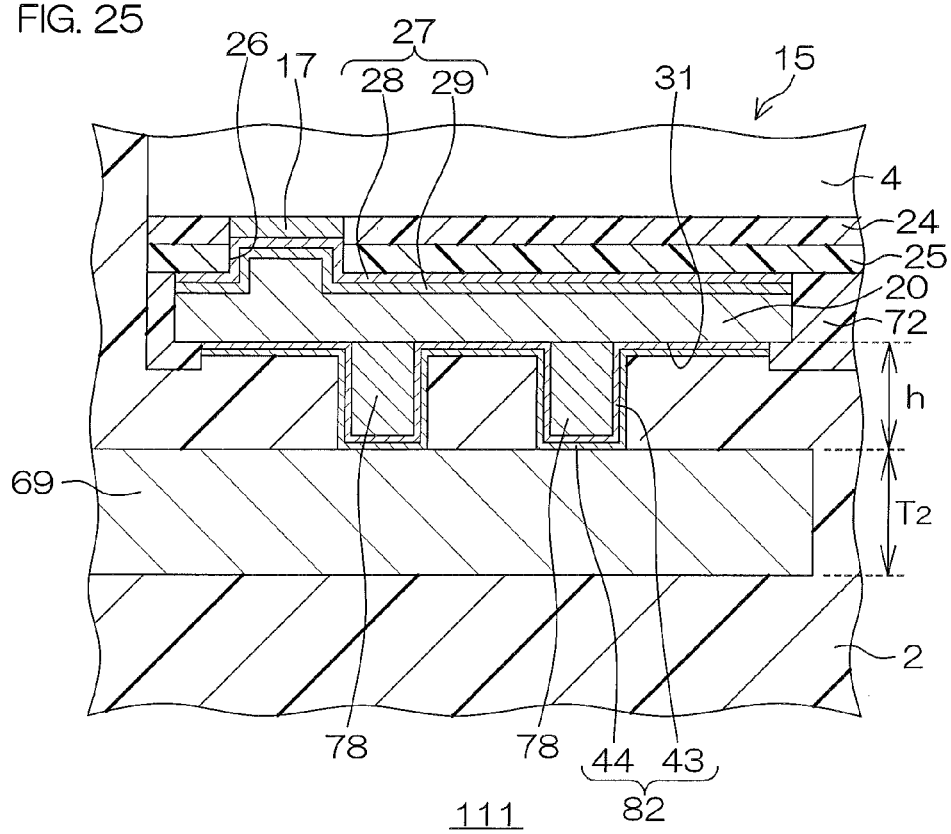
FIG. 25 is a schematic enlarged sectional view showing a wiring region of a semiconductor device according to a sixteenth embodiment of the present invention.

FIG. 25 is a schematic enlarged sectional view showing a wiring region 15 of a semiconductor device 111 according to a sixteenth embodiment of the present invention.

The semiconductor device 111 of the sixteenth embodiment differs from the semiconductor device 81 of the tenth embodiment in that the semiconductor chip 4 is directly connected to the wiring plates 69 via the posts 78 and the metal plating films 82 through flip-chip connection. Except for this arrangement, the semiconductor device 111 has substantially the same construction as the semiconductor device 81 of the tenth embodiment. In FIG. 25, components corresponding to those shown in FIGS. 1 to 24 are designated by the same reference characters as in FIGS. 1 to 24, and duplicate description will be omitted.

The semiconductor device 111 having the aforementioned construction provides the same effects as in the fifteenth embodiment. In FIG. 25, the rewiring protection film 72 is provided by way of example, but may be obviated.

Figure 26:
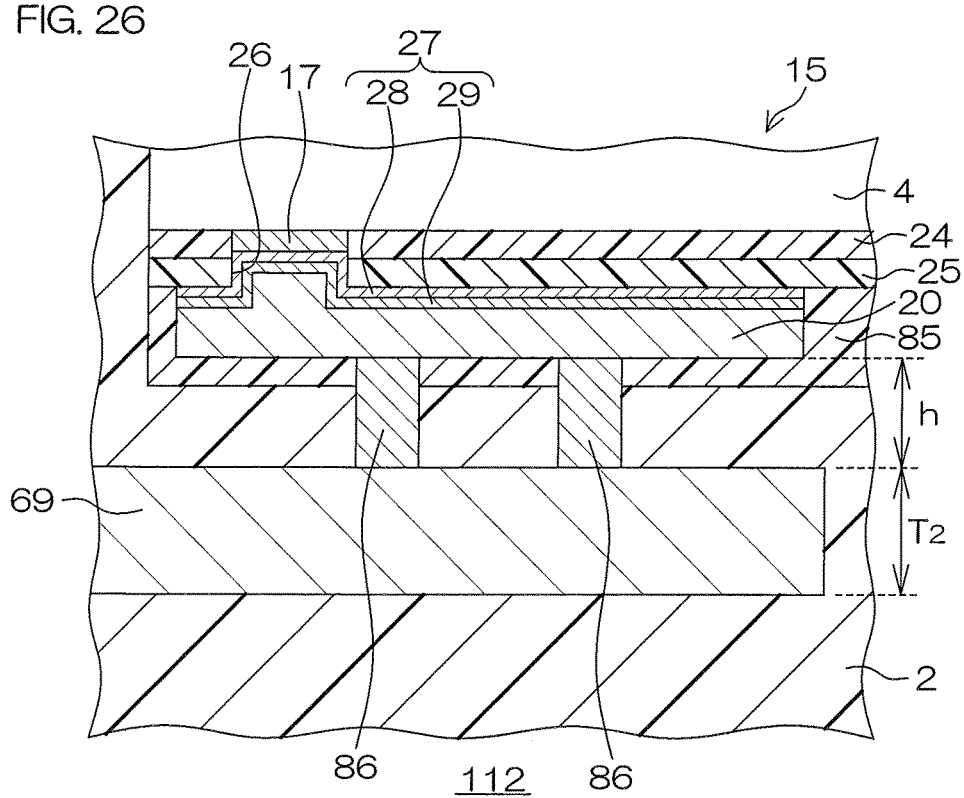
FIG. 26 is a schematic enlarged sectional view showing a wiring region of a semiconductor device according to a seventeenth embodiment of the present invention.

FIG. 26 is a schematic enlarged sectional view showing a wiring region 15 of a semiconductor device 112 according to a seventeenth embodiment of the present invention.

The semiconductor device 112 of the seventeenth embodiment differs from the semiconductor device 84 of the eleventh embodiment in that the semiconductor chip 4 is directly connected to the wiring plates 69 via the posts 86 through flip-chip connection. Except for this arrangement, the semiconductor device 112 has substantially the same construction as the semiconductor device 88 of the eleventh embodiment. In FIG. 26, components corresponding to those shown in FIGS. 1 to 25 are designated by the same reference characters as in FIGS. 1 to 25, and duplicate description will be omitted.

The semiconductor device 112 having the aforementioned construction provides the same effects as in the fifteenth embodiment.

Figure 27:
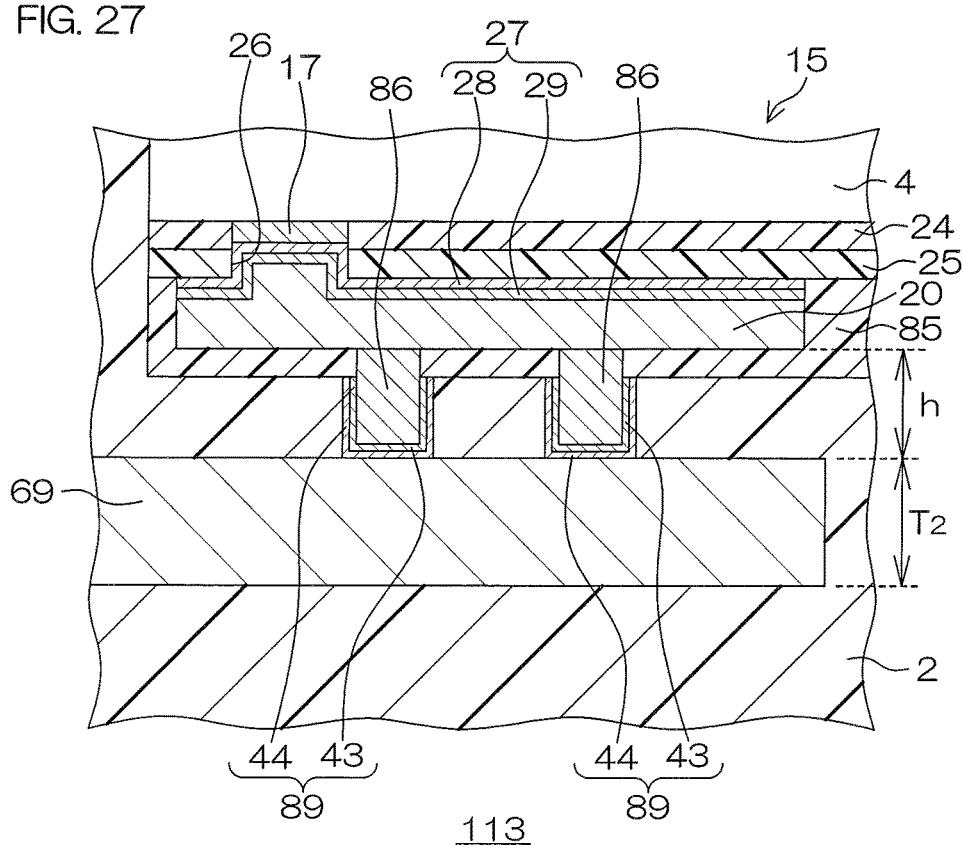
FIG. 27 is a schematic enlarged sectional view showing a wiring region of a semiconductor device according to an eighteenth embodiment of the present invention.

FIG. 27 is a schematic enlarged sectional view showing a wiring region 15 of a semiconductor device 113 according to an eighteenth embodiment of the present invention.

The semiconductor device 113 of the eighteenth embodiment differs from the semiconductor device 88 of the twelfth embodiment in that the semiconductor chip 4 is directly connected to the wiring plates 69 via the posts 78 and the metal plating films 89 through flip-chip connection. Except for this arrangement, the semiconductor device 113 has substantially the same construction as the semiconductor device 88 of the twelfth embodiment. In FIG. 27, components corresponding to those shown in FIGS. 1 to 26 are designated by the same reference characters as in FIGS. 1 to 26, and duplicate description will be omitted.

The semiconductor device 113 having the aforementioned construction provides the same effects as in the fifteenth embodiment.

While the embodiments of the present invention have thus been described, the invention may be embodied in other ways.

In the embodiments described above, the leads 3 each include the inner lead portion 6 and the outer lead portion 7 by way of example. The semiconductor devices may be of a back side mounting type in which the leads are entirely embedded in the resin package 2. In this case, the semiconductor devices may each have a construction as shown in FIGS. 28 and 29.

Figure 28:
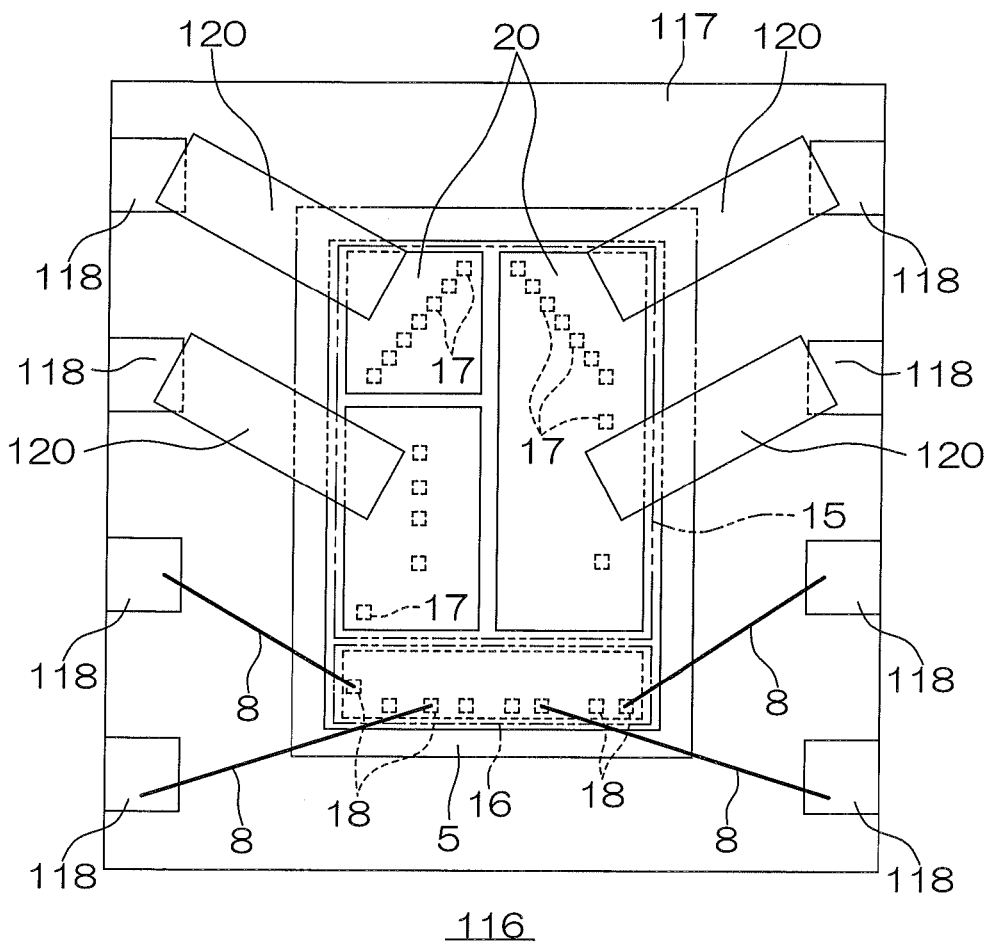
FIG. 28 is a schematic plan view showing the inside of a semiconductor device according to a modification of the present invention.
Figure 29:
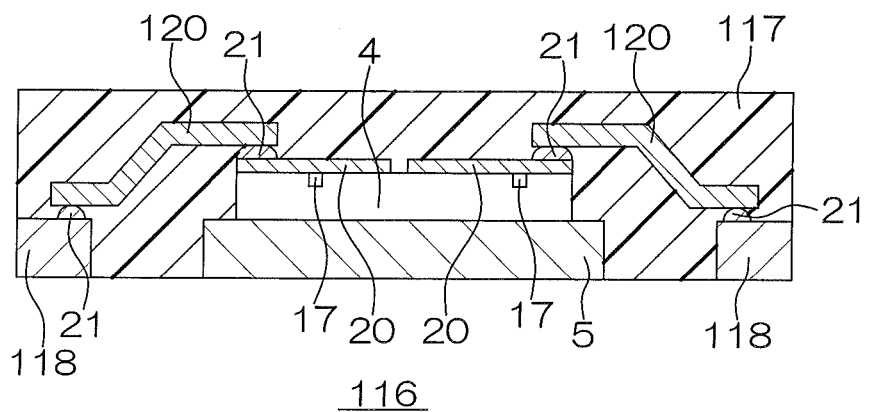
FIG. 29 is a schematic sectional view of the semiconductor device shown in FIG. 28.

FIG. 28 is a schematic plan view showing the inside of a semiconductor device 116 according to a modification of the present invention. FIG. 29 is a schematic sectional view of the semiconductor device 116 shown in FIG. 28.

The semiconductor device 116 of the modification differs from the semiconductor device 1 of the first embodiment in that the semiconductor device 116 is of a back side mounting type in which, unlike the leads 3, leads 118 are embedded in a resin package 117. Except for this arrangement, the semiconductor device 116 has substantially the same construction as the semiconductor device 1 of the first embodiment. In FIG. 28, components corresponding to those shown in FIGS. 1 to 27 are designated by the same reference characters as in FIGS. 1 to 27, and duplicate description will be omitted. With reference to FIGS. 28 and 29, the semiconductor device 116 is described as a modification of the semiconductor device 1 of the first embodiment for convenience of description, but the arrangement of the semiconductor device 116 may be combined with any of the aforementioned embodiments.

As shown in FIG. 28, the leads 118 are embedded in the resin package 117 of the semiconductor device 116. The leads 118 are spaced from opposite edges of the semiconductor chip 4. Parts of the leads 118 are exposed in side surfaces and back surface (in which the island 5 is exposed) of the resin package 117, and the other parts of the leads 118 are sealed in the resin package 117. The leads 118 are selectively connected to the rewirings 20 via arch-shaped clips 120 (an example of the electrically conductive plate in the present invention) in the resin package 117. On the other hand, the parts of the leads 118 exposed in the back surface of the resin package 117 are connected, for example, to a printed board.

The semiconductor device 116 having the aforementioned construction provides the same effects as in the first embodiment.

In the first to sixth embodiments, the clips 9 are connected to the wiring pads 31 via the solder 21 by way of example, but may be directly electrically connected to the rewirings 20 as in the thirteenth to eighteenth embodiments.

In the first to sixth embodiments, the second electrode pads 18 in the signal region 16 are connected to the inner lead portions 6 via the bonding wires 8 by way of example, but signal region rewirings 67 may be provided which are connected to the leads 3 via the clips 9 as in the seventh to seventeenth embodiments. In this case, the posts 78, 86 may be provided on the signal region wiring pads 70 as in the ninth and seventeenth embodiments.

In the first to twelfth embodiments, the semiconductor chip 4 is connected to the connection members (the clips 9 and the wiring plates 69) via the solder balls 21 by way of example, but the solder 21 may be a solder paste such as of Ag.

In the seventh to thirteenth embodiments, the semiconductor chip 4 is connected to the wiring plates 69 through flip-chip connection byway of example, but may be connected to the inner lead portions 6 through flip-chip connection.

In the thirteenth to eighteenth embodiments, the semiconductor chip 4 is connected directly to the wiring plates 69 through flip-chip connection by way of example, but may be connected directly to the inner lead portions 6 through flip-chip connection.

In the embodiments described above, the first and second electrode pads 17, 18 are electrically connected to the rewirings 20, 67 via the UBM films 27, 73, respectively, by way of example, but may be electrically connected directly to the rewirings 20, 67.

Various other modifications may be made within the scope of the present invention defined by the appended claims.

The invention claimed is:
1. A semiconductor device comprising:
   a semiconductor chip including an integrated circuit;
   a plurality of electrode pads provided on the semiconductor chip and connected to the integrated circuit, the plurality of electrode pads being kept at the same potential as each other;
   a rewiring to which the electrode pads are electrically connected together, the rewiring being formed around a surface of the semiconductor chip and having a top surface larger than a top surface of each of the electrode pads, the rewiring having a region collectively covering the plurality of electrode pads;
   a resin package which seals the semiconductor chip;
   a plurality of leads including a first lead and a second lead selectively sealed in the resin package, the first lead and the second lead being partly exposed from the resin package as external terminals that are separated from each other;
   a first connection plate sealed in the resin package to form an electrical connection between the rewiring and the first lead;
   a second connection plate sealed in the resin package to form an electrical connection between the rewiring and the second lead; and
   a protection film having a pad opening through which a part of the top surface of the rewiring is selectively exposed as a wiring pad, wherein
   the rewiring includes one rewiring, and
   further wherein the first and second connection plates are connected to the one rewiring.
2. The semiconductor device according to claim 1, wherein the rewiring is a first rewiring and the semiconductor device includes a second rewiring, the first and second rewirings being provided on the semiconductor chip and spaced from each other along the surface of the semiconductor chip.
3. The semiconductor device according to claim 1, wherein the semiconductor chip is connected to the first and second connection plates in an attitude such that the surface of the semiconductor chip formed with the rewiring therearound faces up.
4. The semiconductor device according to claim 3, further comprising solders, wherein the rewiring is connected to the first and second connection plates via the solders.

5. The semiconductor device according to claim 3, further comprising a columnar post projecting from a surface of the rewiring.
6. The semiconductor device according to claim 1, wherein the semiconductor chip is connected to the first and second connection plates in an attitude such that the surface of the semiconductor chip formed with the rewiring therearound faces down.
7. The semiconductor device according to claim 6, further comprising a columnar post projecting from a surface of the rewiring.
8. The semiconductor device according to claim 7, wherein the post includes posts connected directly to the first and second connection plates.
9. The semiconductor device according to claim 6, further comprising solders, wherein the rewiring is connected to the first and second connection plates via the solders.
10. The semiconductor device according to claim 5, wherein the post includes a plurality of posts arranged in an array.
11. The semiconductor device according to claim 5, wherein the post is provided in a region in which the electrode pads are absent.
12. The semiconductor device according to claim 5, wherein the post includes a Cu-containing metal material.
13. The semiconductor device according to claim 12, wherein the post is selectively coated by Ni plating or Ni/Pd (nickel/palladium) plating.
14. The semiconductor device according to claim 5, wherein the protection film covers the rewiring, and
   wherein the post is connected to the rewiring via the pad opening.
15. The semiconductor device according to claim 5, wherein the protection film covers the rewiring,
   wherein the post extends through the protection film to be electrically connected to the rewiring.
16. The semiconductor device according to claim 1, wherein the rewiring includes a Cu- or Al-containing metal material.
17. The semiconductor device according to claim 16, wherein the rewiring is selectively coated by Ni plating or Ni/Pd (nickel/palladium) plating.
18. The semiconductor device according to claim 1, further comprising an under-bump metal layer, wherein the rewiring is connected to the electrode pads via the under-bump metal layer.
19. The semiconductor device according to claim 1, wherein the electrode pads are made of an Al-containing metal material.
20. The semiconductor device according to claim 1, wherein the first and second connection plates include a conductive flat plate.
21. The semiconductor device according to claim 1, wherein the wiring pad includes the region collectively covering the plurality of electrode pads.
22. A semiconductor device comprising:
   a semiconductor chip including an integrated circuit;
   a plurality of electrode pads provided on the semiconductor chip and connected to the integrated circuit, the plurality of electrode pads being kept at the same potential as each other:
   a rewiring to which the electrode pads are electrically connected together, the rewiring being formed around a surface of the semiconductor chip and having a top surface larger than a top surface of each of the electrode pads, the rewiring having a region collectively covering the plurality of electrode pads;
   a resin package which seals the semiconductor chip;

a plurality of leads including a first lead and a second lead selectively sealed in the resin package, the first lead and the second lead being partly exposed from the resin package as external terminals that are separated from each other;

a first connection plate sealed in the resin package to form an electrical connection between the rewiring and the first lead;

a second connection plate sealed in the resin package to form an electrical connection between the rewiring and the second lead; and a protection film having a pad opening through which a part of the top surface of the rewiring is selectively exposed as a wiring pad, wherein the wiring pad includes the region collectively covering the plurality of electrode pads.

23. The semiconductor device according to claim 22, wherein the rewiring is a first rewiring and the semiconductor device includes a second rewiring, the first and second rewirings being provided on the semiconductor chip and spaced from each other along the surface of the semiconductor chip.

24. The semiconductor device according to claim 22, wherein the semiconductor chip is connected to the first and second connection plates in an attitude such that the surface of the semiconductor chip formed with the rewiring therearound faces up.

25. The semiconductor device according to claim 24, further comprising solders, wherein the rewiring is connected to the first and second connection plates via the solders.

26. The semiconductor device according to claim 24, further comprising a columnar post projecting from a surface of the rewiring.

27. The semiconductor device according to claim 22, wherein the semiconductor chip is connected to the first and second connection plates in an attitude such that the surface of the semiconductor chip formed with the rewiring therearound faces down.

28. The semiconductor device according to claim 27, further comprising a columnar post projecting from a surface of the rewiring.

29. The semiconductor device according to claim 28, wherein the post includes posts connected directly to the first and second connection plates.

30. The semiconductor device according to claim 27, further comprising solders, wherein the rewiring is connected to the first and second connection plates via the solders.

31. The semiconductor device according to claim 26, wherein the post includes a plurality of posts arranged in an array.

32. The semiconductor device according to claim 26, wherein the post is provided in a region in which the electrode pads are absent.

33. The semiconductor device according to claim 26, wherein the post includes a Cu-containing metal material.

34. The semiconductor device according to claim 33, wherein the post is selectively coated by Ni plating or Ni/Pd (nickel/palladium) plating.

35. The semiconductor device according to claim 26, wherein the protection film covers the rewiring, and
wherein the post is connected to the rewiring via the pad opening.

36. The semiconductor device according to claim 26, wherein the protection film covers the rewiring,
wherein the post extends through the protection film to be electrically connected to the rewiring.

37. The semiconductor device according to claim 22, wherein the rewiring includes a Cu- or Al-containing metal material.

38. The semiconductor device according to claim 37, wherein the rewiring is selectively coated by Ni plating or Ni/Pd (nickel/palladium) plating.

39. The semiconductor device according to claim 22, further comprising an under-bump metal layer, wherein the rewiring is connected to the electrode pads via the under-bump metal layer.

40. The semiconductor device according to claim 22, wherein the electrode pads are made of an Al-containing metal material.

41. The semiconductor device according to claim 22, wherein the first and second connection plates include a conductive flat plate.

* * * * *